US012622282B2

(12) United States Patent
Yamada et al.

(10) Patent No.: US 12,622,282 B2
(45) Date of Patent: May 5, 2026

(54) HIGH-FREQUENCY MODULE AND COMMUNICATION DEVICE

(71) Applicant: Murata Manufacturing Co., Ltd., Nagaokakyo (JP)

(72) Inventors: Takashi Yamada, Nagaokakyo (JP); Kiyoshi Aikawa, Nagaokakyo (JP); Hiromichi Kitajima, Nagaokakyo (JP); Takanori Uejima, Nagaokakyo (JP); Yoshihiro Daimon, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 418 days.

(21) Appl. No.: 18/477,589

(22) Filed: Sep. 29, 2023

(65) Prior Publication Data

US 2024/0038692 A1 Feb. 1, 2024

Related U.S. Application Data

(63) Continuation of application No. PCT/JP2022/010867, filed on Mar. 11, 2022.

(30) Foreign Application Priority Data

Mar. 31, 2021 (JP) ................................. 2021-059997

(51) Int. Cl.
*H01L 23/66* (2006.01)
*H01L 23/498* (2006.01)
(Continued)

(52) U.S. Cl.
CPC ........ *H01L 23/66* (2013.01); *H01L 23/49822* (2013.01); *H01L 23/49838* (2013.01);
(Continued)

(58) Field of Classification Search
CPC ............. H01L 2223/6677; H01L 23/66; H01L 23/49822; H01L 23/49838; H01L 23/5385; H01L 23/552; H03F 2200/451; H04B 1/38
(Continued)

(56) References Cited

U.S. PATENT DOCUMENTS

2015/0119102 A1* 4/2015 Saji ...................... H05K 9/0045
455/550.1
2015/0144703 A1* 5/2015 Droz ...................... H05K 3/368
29/601
(Continued)

FOREIGN PATENT DOCUMENTS

JP 2001-210954 A 8/2001
JP 2003-258192 A 9/2003
(Continued)

OTHER PUBLICATIONS

International Search Report and Written Opinion mailed on Jun. 7, 2022, received for PCT Application PCT/JP2022/010867, filed on Mar. 11, 2022, 12 pages including English Translation.

*Primary Examiner* — Didarul A Mazumder
(74) *Attorney, Agent, or Firm* — XSENSUS LLP

(57) ABSTRACT

A high-frequency module includes a first module substrate including first and second major surfaces, and a second module substrate including third and fourth major surfaces. The first major surface (faces the second major surface. Electronic components are disposed between the second and third major surfaces, on the first major surface, and on the fourth major surface. External connection terminals are disposed on the fourth major surface. A recess is formed in the first major surface. The electronic components include a first electronic component and a second electronic component (shorter in height than the first electronic component. The first electronic component is disposed in the recess, and
(Continued)

the second electronic component is disposed in a region outside of the recess on the first major surface.

20 Claims, 8 Drawing Sheets

(51) Int. Cl.
    *H01L 25/065*     (2023.01)
    *H03F 1/56*     (2006.01)
    *H03F 3/24*     (2006.01)

(52) U.S. Cl.
    CPC ......... *H01L 25/0652* (2013.01); *H03F 1/565* (2013.01); *H03F 3/245* (2013.01); *H01L 2223/6616* (2013.01); *H01L 2223/6655* (2013.01); *H01L 2223/6672* (2013.01); *H01L 2223/6677* (2013.01); *H03F 2200/294* (2013.01); *H03F 2200/451* (2013.01)

(58) Field of Classification Search
    USPC ........................................................ 257/728
    See application file for complete search history.

(56) References Cited

U.S. PATENT DOCUMENTS

| | | | |
|---|---|---|---|
| 2018/0033738 A1* | 2/2018 | Kawabata | H01L 23/552 |
| 2018/0166394 A1* | 6/2018 | Otsubo | H01L 23/13 |
| 2019/0326256 A1* | 10/2019 | Chang | H01L 21/561 |
| 2019/0378779 A1* | 12/2019 | Fujii | H01L 23/498 |
| 2020/0251459 A1* | 8/2020 | Tsuda | H01L 23/66 |
| 2020/0343151 A1* | 10/2020 | Nomura | H01L 23/49811 |
| 2020/0373289 A1* | 11/2020 | Yang | H01L 24/83 |

FOREIGN PATENT DOCUMENTS

| | | |
|---|---|---|
| JP | 2004-071597 A | 3/2004 |
| JP | 2004-296613 A | 10/2004 |
| JP | 2009-130196 A | 6/2009 |
| WO | 2020/022180 A1 | 1/2020 |
| WO | 2021/039068 A1 | 3/2021 |

* cited by examiner

HIGH-FREQUENCY MODULE AND COMMUNICATION DEVICE

CROSS-REFERENCE TO RELATED APPLICATIONS

This application is a continuation of international application no. PCT/JP2022/010867, filed Mar. 11, 2022, and which claims priority to Japanese application no. 2021-059997, filed Mar. 31, 2021. The entire contents of both prior applications are hereby incorporated by reference.

TECHNICAL FIELD

The present disclosure relates to a high-frequency module and a communication device.

BACKGROUND ART

In mobile communication devices, such as cellular phones, high-frequency front-end modules are becoming more and more complicated with an increasing number of bands to be supported in particular. A technique has been proposed to reduce the size of a high-frequency module by using two module substrates.

CITATION LIST

Patent Document

Patent Document 1: International Publication No. WO 2020/022180

SUMMARY

Technical Problem

According to the aforementioned technique in the related art, however, the height of the high-frequency module is increased.

The present disclosure therefore provides a high-frequency module and a communication device that can be reduced in size while being inhibited from increasing in height.

Solution to Problem

A high-frequency module according to an aspect of the present disclosure includes: a first module substrate including a first major surface opposite a second major surface; a second module substrate including a third major surface opposite a fourth major surface, the third major surface facing the second major surface; a plurality of electronic components disposed between the second major surface and the third major surface, on the first major surface, and on the fourth major surface; and a plurality of external connection terminals disposed on the fourth major surface. A recess is formed in one of the first and second major surfaces included in the first module substrate or one of the third and fourth major surfaces included in second module substrate. The plurality of electronic components include a first electronic component, and a second electronic component shorter in height than the first electronic component. At least a part of the first electronic component is disposed in the recess. The second electronic component is disposed outside of the recess on the first major surface, the second major surface, the third major surface, or the fourth major surface in which the recess is formed or on the first major surface, the second major surface, the third major surface, or the fourth major surface that faces the first major surface, the second major surface, the third major surface, or the fourth major surface in which the recess is formed.

Exemplary Advantageous Effects

The high-frequency module according to an aspect of the present disclosure can be reduced in size while being inhibited from increasing in height.

DESCRIPTION OF EMBODIMENTS

Figure 1:
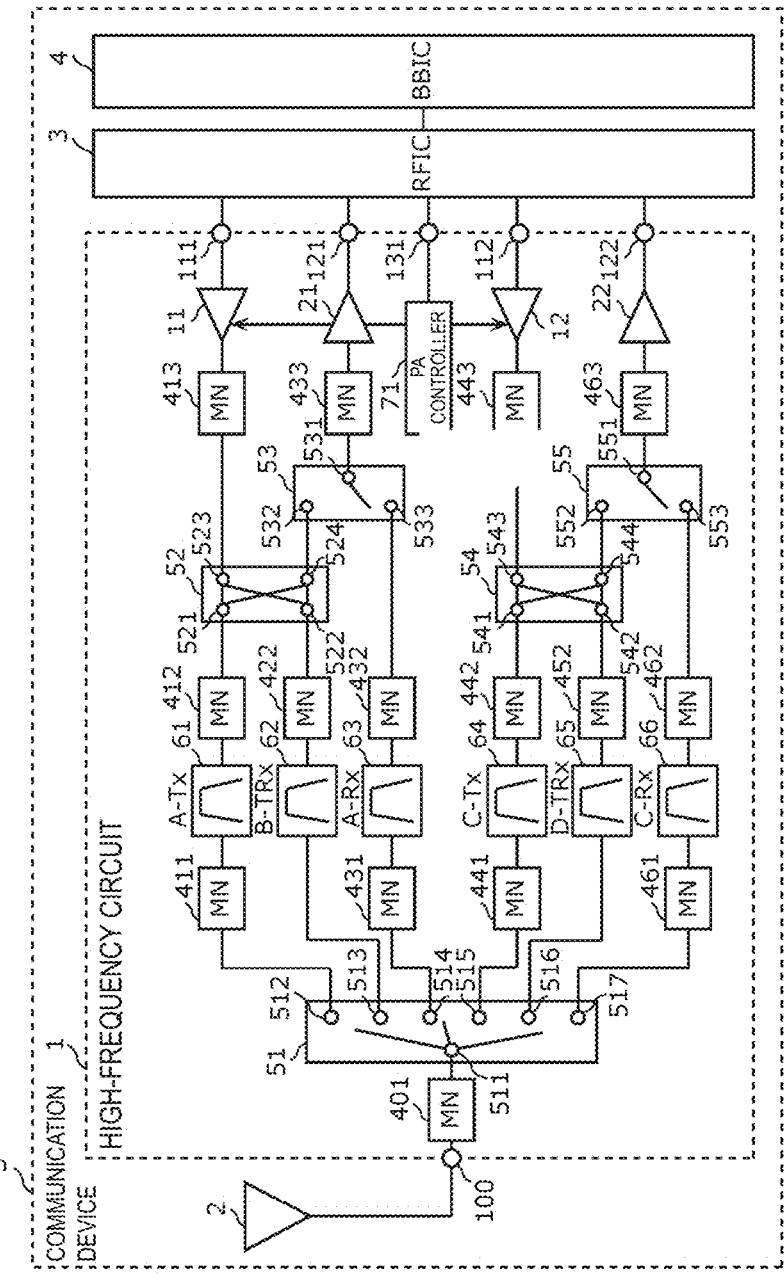
FIG. 1 is a circuit diagram of a high-frequency circuit and a communication device according to an exemplary embodiment.

Hereinafter, an exemplary embodiment of the present disclosure is described in detail using the drawings. The exemplary embodiment described below illustrates a comprehensive or specific example. The numerical values, shapes, materials, constituent components, arrangements and connections of the constituent components, and the like described in the following embodiment are illustrative only and will not limit the present disclosure.

Each drawing is a schematic diagram including proper emphases, omissions, or adjustment of proportions in order to show the present disclosure and is not always illustrated exactly. The shapes, positional relationships, and proportions in each drawing are sometimes different from actual ones. In the drawings, substantially identical configurations are denoted by the same reference numerals, and redundant description may be omitted or simplified.

In each drawing below, x- and y-axes are orthogonal to each other on a plane parallel to the major surfaces of a module substrate. Specifically, when the module substrate is rectangular in a planar view, the x-axis is parallel to a first side of the module substrate, and the y-axis is parallel to a second side of the module substrate that is orthogonal to the first side. z-axis is vertical to the major surfaces of the module substrate, and the positive z-axis direction thereof is an upward direct while the negative z-axis direction is a downward direction.

In the circuit configuration of the present disclosure, "to be coupled" includes not only to be directly coupled with a connection terminal and/or a trace conductor but also to be electrically coupled via another circuit element. "To be coupled between A and B" indicates to be coupled to both A and B between A and B and includes, in addition to be coupled in series to a path connecting A and B, to be coupled in parallel between the path and ground (shunt connection).

In a component arrangement of the present disclosure, a "planar view" refers to a view of an object orthogonally projected onto an x-y plane as seen in the negative z-axis direction. "A overlaps B in a planar view" means that the region of A orthogonally projected onto the x-y plane overlaps the region of B orthogonally projected onto the x-y plane. "A is disposed between B and C" means that at least one of plural line segments connecting any point within B and any point within C passes through A. "A is joined to B" means that A is physically coupled to B. Terms indicating relationships between elements, such as "parallel" or "vertical", terms indicating element shapes, such as "rectangular", and numerical ranges express not only their exact meaning but also substantially equivalent ranges, for example, including several percent errors.

In component arrangements of the present disclosure, "a component is disposed in a substrate" includes the component being disposed on a major surface of the substrate and the component being disposed within the substrate. "A component is disposed on a major surface of a substrate" includes not only the component being disposed in contact with a major surface of the substrate but also the component being disposed on a major surface side without being in contact with the major surface (for example, the component is stacked atop another component disposed in contact with the major surface). In addition, "a component is disposed on a major surface of a substrate" may include the component being within a recess formed in the major surface. This means that the bottom surface of the recess formed in the major surface is included in the major surface.

In a component arrangement of the present disclosure, "A component is disposed within a substrate" means that the component is encapsulated within the module substrate and does not include either of the component being fully disposed between the major surfaces of the substrate but being partially exposed from the substrate or the component being partially disposed within the substrate. "A component is disposed between two major surfaces" includes not only the component being disposed in contact with both the two major surfaces but also the component being disposed in contact with only one of the two major surfaces or disposed without being in contact with either of the two major surfaces.

Embodiment

[1 Circuit Configuration of High-Frequency Circuit 1 and Communication Device 5]

The circuit configurations of a high-frequency circuit 1 and a communication device 5 according to an exemplary embodiment are described with reference to FIG. 1. FIG. 1 is a circuit diagram of the high-frequency circuit 1 and communication device 5 according to the exemplary embodiment.

[1.1 Circuit Configuration of Communication Device 5]

First, the circuit configuration of the communication device 5 is described. As illustrated in FIG. 1, the communication device 5 according to the exemplary embodiment includes the high-frequency circuit 1, an antenna 2, a radio frequency integrated circuit (RFIC) 3, and a baseband integrated circuit (BBIC) 4.

The high-frequency circuit 1 transfers high-frequency signals between the antenna 2 and the RFIC 3. The internal configuration of the high-frequency circuit 1 is described later.

The antenna 2 is coupled to an antenna connection terminal 100 of the high-frequency circuit 1. The antenna 2 transmits a high-frequency signal outputted from the high-frequency circuit 1. The antenna 2 receives a high-frequency signal from the outside and outputs the received high-frequency signal to the high-frequency circuit 1.

The RFIC 3 is an example of a signal processing circuit to process high-frequency signals. Specifically, the RFIC 3 performs signal processing, such as down-conversion, for a high-frequency reception signal inputted through a reception path of the high-frequency circuit 1 and outputs to the BBIC 4, the reception signal generated through the signal processing. The RFIC 3 performs signal processing, such as up-conversion, for a transmission signal inputted from the BBIC 4 and outputs a high-frequency transmission signal generated by the signal processing to a transmission path of the high-frequency circuit 1. The RFIC 3 includes a controller to control switches, amplifiers, and other elements included in the high-frequency circuit 1. Part of or all of the functions of the RFIC 3 as a controller may be implemented outside the RFIC 3 and, for example, may be implemented in the BBIC 4 or the high-frequency circuit 1.

The BBIC 4 is a baseband signal processing circuit that performs signal processing using an intermediate frequency band lower than frequencies of high-frequency signals transferred by the high-frequency circuit 1. Examples of the signals to be processed by the BBIC 4 are image signals for image display and/or audio signals for voice calls using a speaker.

In the communication device 5 according to the exemplary embodiment, the antenna 2 and BBIC 4 are not essential constituent elements.

[1.2 Circuit Configuration of High-Frequency Circuit 1]

Next, the circuit configuration of the high-frequency circuit 1 is described. As illustrated in FIG. 1, the high-frequency circuit 1 includes power amplifiers (PAs) 11 and 12, low-noise amplifiers (LNAs) 21 and 22, matching networks (MN) 401, 411 to 413, 422, 431 to 433, 441 to 443, 452, and 461 to 463, switches (SWs) 51 to 55, filters 61 to 66, a PA controller (PAC) 71, the antenna connection terminal 100, high-frequency input terminals 111 and 112, high-frequency output terminals 121 and 122, and control terminal 131. Hereinafter, the constituent elements of the high-frequency circuit 1 are described sequentially.

The antenna connection terminal 100 is coupled to the antenna 2 outside the high-frequency circuit 1.

Each of the high-frequency input terminals 111 and 112 is a terminal to receive high-frequency transmission signals from the outside of the high-frequency circuit 1. In the embodiment, the high-frequency input terminals 111 and 112 are coupled to the RFIC 3 outside the high-frequency circuit 1.

Each of the high-frequency output terminals 121 and 122 is a terminal to supply high-frequency reception signals to the outside of the high-frequency circuit 1. In the exemplary embodiment, the high-frequency output terminals 121 and 122 are coupled to the RFIC 3 outside the high-frequency circuit 1.

The control terminal 131 are terminals to transfer control signals. Specifically, the control terminal 131 are terminals to receive control signals from the outside of the high-frequency circuit 1 and/or terminals to supply control signals to the outside of the high-frequency circuit 1. The control signals are signals concerning control of electronic circuits included in the high-frequency circuit 1. Specifically, the control signals are digital signals to control at least one of the power amplifiers 11 and 12, low-noise amplifiers 21 and 22, and switches 51 to 55, for example.

The power amplifier 11 is coupled between the high-frequency input terminal 111 and the filters 61 and 62 and is able to amplify transmission signals in bands A and B. Specifically, the input end of the power amplifier 11 is coupled to the high-frequency input terminal 111. The output end of the power amplifier 11 is coupled to the filter 61 via the matching network 413, switch 52, and matching network 412. The output end of the power amplifier 11 is also coupled to the filter 62 via the matching network 413, switch 52, and matching network 422.

The power amplifier 12 is coupled between the high-frequency input terminal 112 and the filters 64 and 65 and is able to amplify transmission signals in bands C and D. Specifically, the input end of the power amplifier 12 is coupled to the high-frequency input terminal 112. The output end of the power amplifier 12 is coupled to the filter 64 via the matching network 443, switch 54, and matching network 442. The output end of the power amplifier 12 is also coupled to the filter 65 via the matching network 443, switch 54, and matching network 452.

The power amplifiers 11 and 12 are electronic components that provide an output signal having a larger energy than an input signal (a transmission signal) based on power supplied from a power supply. Each of the power amplifiers 11 and 12 includes an amplification transistor and may further include an inductor and/or a capacitor. The internal configuration of the power amplifiers 11 and 12 are not limited. For example, each of the power amplifiers 11 and 12 may be a multistage amplifier, a differential amplifier, or a Doherty amplifier.

The low-noise amplifier 21 is coupled between the filter 62 and 63 and the high-frequency output terminal 121 and is able to amplify reception signals in the bands A and B. Specifically, the input end of the low-noise amplifier 21 is coupled to the filter 62 via the matching network 433, switches 53 and 52, and matching network 422. The input end of the low-noise amplifier 21 is also coupled to the filter 63 via the matching network 433, switch 53, and matching network 432. The output end of the low-noise amplifier 21 is coupled to the high-frequency output terminal 121.

The low-noise amplifier 22 is coupled between the filters 65 and 66 and the high-frequency output terminal 122 and is able to amplify reception signals in the bands C and D. Specifically, the input end of the low-noise amplifier 22 is coupled to the filter 65 via the matching network 463, switches 55 and 54, and matching network 452. The input end of the low-noise amplifier 22 is also coupled to the filter 66 via the matching network 463, switch 55, and matching network 462. The output end of the low-noise amplifier 22 is coupled to the high-frequency output terminal 122.

The low-noise amplifiers 21 and 22 are electronic components that provide an output signal having a larger energy than that of an input signal (a reception signal) based on power supplied from the power supply. Each of the low-noise amplifiers 21 and 22 includes an amplification transistor and may further include an inductor and/or a capacitor. The internal configurations of the low-noise amplifiers 21 and 22 are not limited.

Each of the matching networks 401, 411 to 413, 422, 431 to 433, 441 to 443, 452, and 461 to 463 is coupled between two circuit elements and is able to provide impedance matching between the two circuit elements. Thus, each of the matching networks 401, 411 to 413, 422, 431 to 433, 441 to 443, 452, and 461 to 463 is an impedance matching network. Each of the matching networks 401, 411 to 413, 422, 431 to 433, 441 to 443, 452, and 461 to 463 includes an inductor and may further include a capacitor.

The matching network 411 is an example of a first inductor and is coupled between the switch 51 and the filter 61. The matching network 431 is an example of the first inductor and is coupled between the switch 51 and the filter 63. The matching network 441 is an example of the first inductor and is coupled between the switch 51 and the filter 64. The matching network 461 is an example of the first inductor and is coupled between the switch 51 and the filter 66.

The matching network 412 is an example of a third inductor and is coupled between the power amplifier 11 and the filter 61. The matching network 413 is an example of the third inductor and is coupled between the power amplifier 11 and the filters 61 and 62. The matching network 442 is an example of the third inductor and is coupled between the power amplifier 12 and the filter 64. The matching network 443 is an example of the third inductor and is coupled between the power amplifier 12 and the filters 64 and 65.

The matching network 401 is coupled between the antenna connection terminal 100 and the switch 51.

The matching network 432 is an example of a second inductor and is coupled between the low-noise amplifier 21 and the filter 63. The matching network 433 is an example of the second inductor and is coupled between the low-noise amplifier 21 and the filter 63. The matching network 462 is an example of the second inductor and is coupled between the low-noise amplifier 22 and the filter 66. The matching network 463 is an example of the second inductor and is coupled between the low-noise amplifier 22 and the filter 66.

The switch 51 is an example of a first switch and is coupled between the antenna connection terminal 100 and the filters 61 to 66. The switch 51 includes terminals 511 to 517. The terminal 511 is coupled to the antenna connection terminal 100. The terminal 512 is coupled to the filter 61 via the matching network 411. The terminal 513 is coupled to the filter 62. The terminal 514 is coupled to the filter 63 via the matching network 431. The terminal 515 is coupled to the filter 64 via the matching network 441. The terminal 516 is coupled to the filter 65. The terminal 517 is coupled to the filter 66 via the matching network 461.

In this connection configuration, the switch 51 is able to connect the terminal 511 to at least one of the terminals 512 to 517 based on a control signal from the RFIC 3, for example. The switch 51 is able to switch whether to couple the antenna connection terminal 100 to each of the filters 61 to 66. The switch 51 is composed of a multi-connection switch circuit, for example, and is sometimes referred to as an antenna switch.

The switch 52 is coupled between the output end of the power amplifier 11 and the filters 61 and 62 and is coupled between the input end of the low-noise amplifier 21 and the filter 62. The switch 52 includes terminals 521 to 524. The terminal 521 is coupled to the filter 61 via the matching network 412. The terminal 522 is coupled to the filter 62 via the matching network 422. The terminal 523 is coupled to the output end of the power amplifier 11 via the matching network 413. The terminal 524 is coupled to the input end of the low-noise amplifier 21 via the switch 53 and matching network 433.

In this connection configuration, the switch 52 is able to couple the terminal 523 to at least one of the terminals 521 and 522 and couple the terminal 522 to at least one of the terminals 523 and 524 based on a control signal from the RFIC 3, for example. The switch 52 is able to switch whether to couple the power amplifier 11 to each of the filters 61 and 62 and is able to switch connections between the filter 62 and the power amplifier 11 and between the filter 62 and the low-noise amplifier 21. The switch 52 is composed of a multi-connection switch circuit, for example.

The switch 53 is coupled between the input end of the low-noise amplifier 21 and the filters 62 and 63. The switch 53 includes terminals 531 to 533. The terminal 531 is coupled to the input end of the low-noise amplifier 21 via the matching network 433. The terminal 532 is coupled to the terminal 524 of the switch 52 and is coupled to the filter 62 via the switch 52 and matching network 422. The terminal 533 is coupled to the filter 63 via the matching network 432.

In this connection configuration, the switch 53 is able to couple the terminal 531 to at least one of the terminals 532 and 533 based on a control signal from the RFIC 3, for example. The switch 53 is thus able to switch whether to couple the low-noise amplifier 21 to each of the filters 62 and 63. The switch 53 is composed of a multi-connection switch circuit, for example.

The switch 54 is coupled between the output end of the power amplifier 12 and the filters 64 and 65 and is coupled between the input end of the low-noise amplifier 22 and the filter 65. The switch 54 includes terminals 541 to 544. The terminal 541 is coupled to the filter 64 via the matching network 442. The terminal 542 is coupled to the filter 65 via the matching network 452. The terminal 543 is coupled to the output end of the power amplifier 12 via the matching network 443. The terminal 544 is coupled to the input end of the low-noise amplifier 22 via the switch 55 and matching network 463.

In this connection configuration, the switch 54 is able to couple the terminal 543 to at least one of the terminals 541 and 542 and couple the terminal 542 to either the terminal 543 or 544 based on a control signal from the RFIC 3, for example. The switch 54 is thus able to switch whether to couple the power amplifier 12 to each of the filters 64 and 65 and switch connections between the filter and the power amplifier 12 and between the filter 65 and the low-noise amplifiers 22. The switch 54 is composed of a multi-connection switch circuit, for example.

The switch 55 is coupled between the input end of the low-noise amplifier 22 and the filters 65 and 66. The switch 55 includes terminals 551 to 553. The terminal 551 is coupled to the input end of the low-noise amplifier 22 via the matching network 463. The terminal 552 is coupled to the terminal 544 of the switch 54 and is coupled to the filter 65 via the switch 54 and matching network 452. The terminal 553 is coupled to the filter 66 via the matching network 462.

In this connection configuration, the switch 55 is able to couple the terminal 551 to at least one of the terminals 552 and 553 based on a control signal from the RFIC 3, for example. The switch 55 is thus able to switch whether to couple the low-noise amplifier 22 to each of the filters 65 and 66. The switch 55 is composed of a multi-connection switch circuit, for example.

The filter 61 (A-Tx) is an example of a first filter and is an example of a third filter. The filter is coupled between the power amplifier 11 and the antenna connection terminal 100. Specifically, an end of the filter 61 is coupled to the antenna connection terminal 100 via the matching network 411, switch 51, and matching network 401. The other end of the filter 61 is coupled to the output end of the power amplifier 11 via the matching network 412, switch 52, and matching network 413. The filter 61 has a pass band including an uplink operation band of the band A for frequency division duplex (FDD) and is able to pass transmission signals in the band A.

The filter 62 (B-TRx) is an example of a first filter. The filter 62 is coupled between the antenna connection terminal 100 and the power amplifier 11 and is coupled between the antenna connection terminal 100 and the low-noise amplifier 21. Specifically, an end of the filter 62 is coupled to the antenna connection terminal 100 via the switch 51 and matching network 401. The other end of the filter 62 is coupled to the output end of the power amplifier 11 via the matching network 422, switch 52, and matching network 413 and is coupled to the input end of the low-noise amplifier 21 via the matching network 422, switches 52 and 53, and matching network 433. The filter 62 has a pass band including the band B for time division duplex (TDD) and is able to pass transmission and reception signals in the band B.

The filter 63 (A-Rx) is an example of a first filter an example of a second filter and is coupled between the low-noise amplifier 21 and the antenna connection terminal 100. Specifically, an end of the filter 63 is coupled to the antenna connection terminal 100 via the matching network 431, switch 51, and matching network 401. The other end of the filter 63 is coupled to the input end of the low-noise amplifier 21 via the matching network 432, switch 53, and matching network 433. The filter 63 has a pass band including a downlink operation band of the band A for FDD and is able to pass reception signals in the band A.

The filter 64 (C-Tx) is an example of the first filter and an example of a third filter. The filter 64 is coupled between power amplifier 12 and the antenna connection terminal 100. Specifically, an end of the filter 64 is coupled to the antenna connection terminal 100 via the matching network 441, switch 51, and matching network 401. The other end of the filter 64 is coupled to the output end of the power amplifier 12 via the matching network 442, switch 54, and matching network 443. The filter 64 has a pass band including an uplink operation band of the band C for FDD and is able to pass transmission signals in the band C.

The filter 65 (D-TRx) is an example of the first filter. The filter 65 is coupled between the antenna connection terminal 100 and the power amplifier 12 and is coupled between the antenna connection terminal 100 and the low-noise amplifier 22. Specifically, an end of the filter 65 is coupled to the antenna connection terminal 100 via the switch 51 and matching network 401. The other end of the filter 65 is coupled to the output end of the power amplifier 12 via the matching network 452, switch 54, and matching network 443 and is coupled to the input end of the low-noise amplifier 22 via the matching network 452, switches 54 and 55, and matching network 463. The filter 65 has a pass band including the band D for TDD and is able to pass transmission and reception signals in the band D.

The filter 66 (C-Rx) is an example of the first filter and an example of the second filter. The filter 66 is coupled between the low-noise amplifier 22 and the antenna connection terminal 100. Specifically, an end of the filter 66 is coupled to the antenna connection terminal 100 via the matching network 461, switch 51, and matching network 401. The other end of the filter 66 is coupled to the input end of the low-noise amplifier 22 via the matching network 462, switch 55, and matching network 463. The filter 66 has a pass band including a downlink operation band of the band C for FDD and is able to pass reception signals in the band C.

The PA controller 71 is able to control the power amplifiers 11 and 12. The PA controller 71 receives digital control signals from the RFIC 3 via the control terminal 131 and outputs control signals to the power amplifiers 11 and 12.

The bands A to D are frequency bands for communication systems built by using a radio access technology (RAT). The bands A to D are previously defined by a standards body or the like (the 3rd Generation Partnership Project (3GPP) or the Institute of Electrical and Electronics Engineers (IEEE), for example). Examples of the communication systems are a 5th generation new radio (5GNR) system, a long term evolution (LTE) system, and a wireless local area network (WLAN) system.

The bands A and B may be included in a different band group from the bands C and D or may be included in the same band group. Herein, a band group indicates a range of frequencies including plural bands. Band groups can be an ultra-high band group (3300 to 5000 MHz), a high-band group (2300 to 2690 MHz), a mid-band group (1427 to 2200 MHz), and a low-band group (698 to 960 MHz), for example, but are not limited thereto. For example, the band groups may include a band group including an unlicensed band not lower than 5 GHz or a band group in the millimeter wave band.

For example, the bands A and B may be included in the high-band group while the bands C and D are included in the mid-band group. Alternatively, the bands A and B may be included in the mid- or high-band group while the bands C and D are included in the low-band group.

The high-frequency circuit 1 is illustrated by way of example in FIG. 1 and is not limited thereto. For example, the bands covered by the high-frequency circuit 1 are not limited to the bands A to D. For example, the high-frequency circuit 1 may be configured to cover five bands or more. In this case, the high-frequency circuit 1 may include filters for bands E, F, G . . . . Alternatively, for example, the high-frequency circuit 1 may be configured to cover only the bands A and B but not the bands C and D. In this case, the high-frequency circuit 1 does not need to include the power amplifier 12, low-noise amplifier 22, matching networks 441 to 443, 452, and 461 to 463, high-frequency input terminal 112, and high-frequency output terminal 122. For example, the high-frequency circuit 1 may be a send-only circuit. In this case, the high-frequency circuit 1 does not need to include the low-noise amplifiers 21 and 22, matching networks 431 to 433 and 461 to 463, switches 53 and 55, filters 63 and 66, and high-frequency output terminals 121 and 122. Alternatively, for example, the high-frequency circuit 1 may be a receive-only circuit. In this case, the high-frequency circuit 1 does not need to include the power amplifiers 11 and 12, matching networks 411 to 413 and 441 to 443, switches 52 and 54, filters 61 and 64, and high-frequency input terminals 111 and 112.

The high-frequency circuit 1 does not need to include all the matching networks 401, 411 to 413, 422, 431 to 433, 441 to 443, 452, and 461 to 463. Furthermore, the high-frequency circuit 1 may be coupled to plural antennas and may include plural antenna connection terminals, for example. The high-frequency circuit 1 may include more high-frequency input terminals. In this case, a switch that is able to switch connections between the power amplifiers and the plural high-frequency input terminals may be provided between the power amplifiers and the plural high-frequency input terminals. The high-frequency circuit 1 may include more high-frequency output terminals. In this case, a switch that is able to switch connections between the low-noise amplifiers and the plural high-frequency output terminals may be provided between the low-noise amplifiers and the plural high-frequency output terminals.

[2 Example of High-Frequency Circuit 1]

2.1 Example 1

As Example 1 of the high-frequency circuit 1 according to the exemplary embodiment, a high-frequency module 1A, in which the high-frequency circuit 1 is implemented, is described with reference to FIGS. 2 to 5.

[2.1.1 Component Arrangement of High-Frequency Module 1A]

Figure 2:
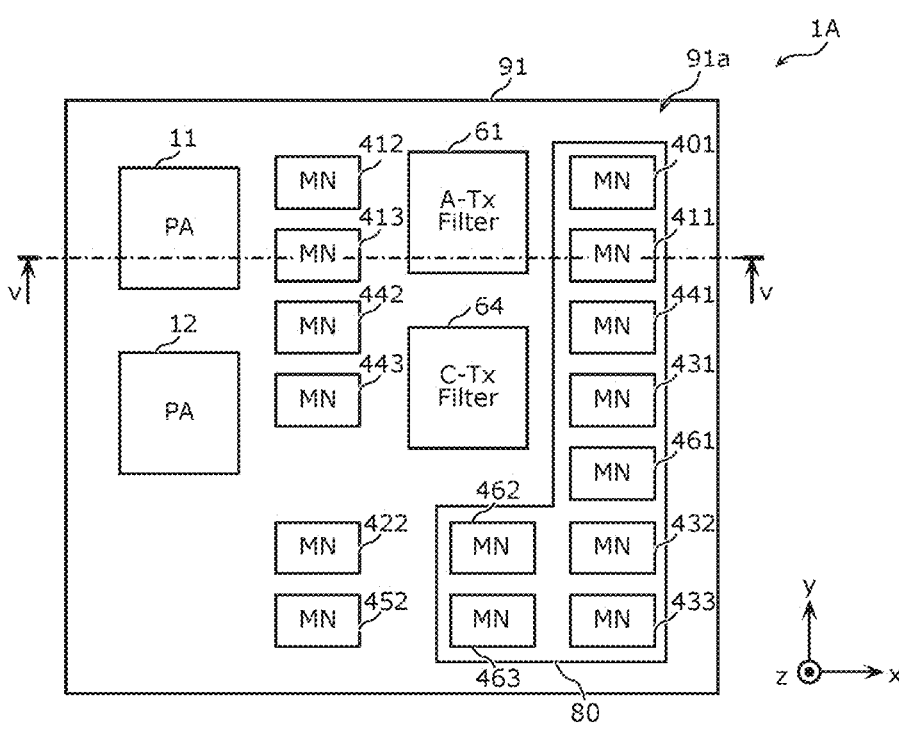
FIG. 2 is a plan view of a first major surface of a high-frequency module according to Example 1.
Figure 3:
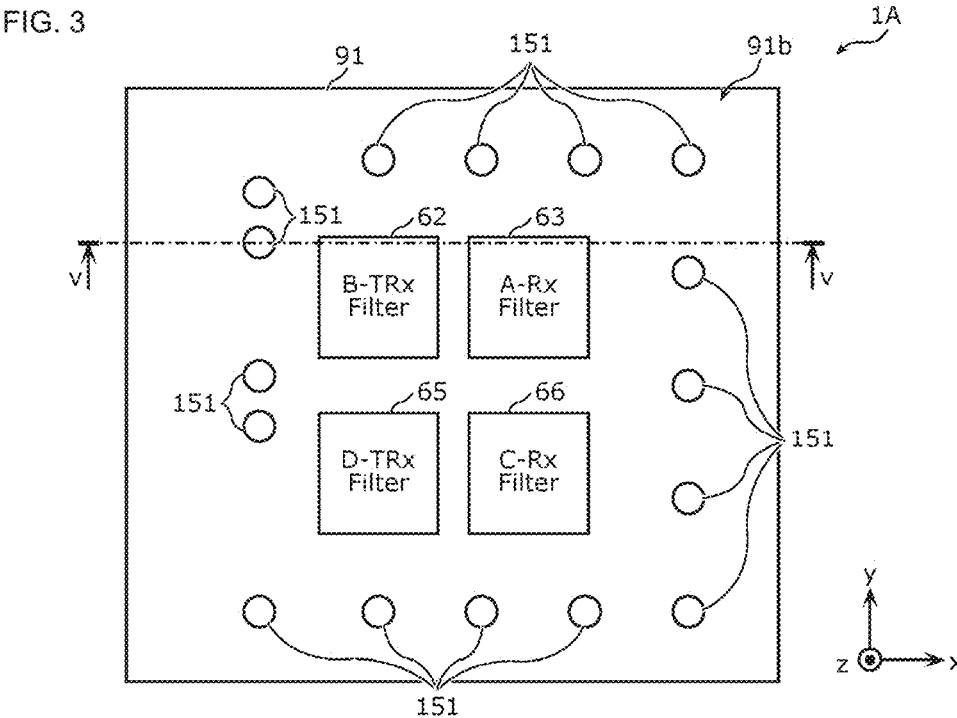
FIG. 3 is a plan view of a second major surface of the high-frequency module according to Example 1.
Figures 4, 5:
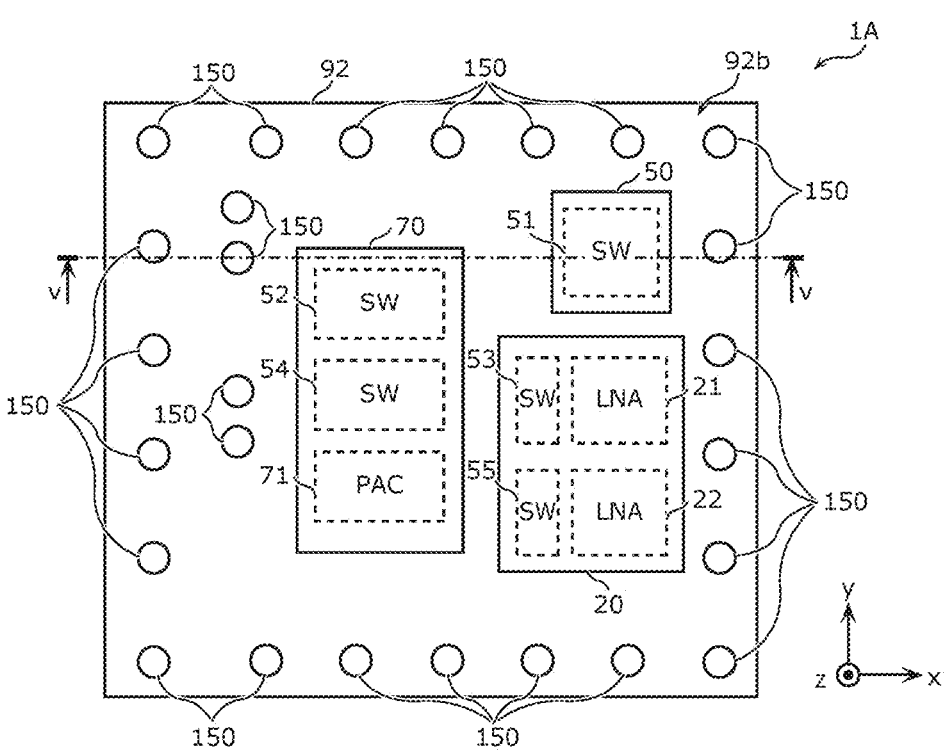
FIG. 4 is a plan view of a fourth major surface of the high-frequency module according to Example 1.
FIG. 5 is a cross-sectional view of the high-frequency module according to Example 1.

FIG. 2 is a plan view of a major surface 91a of the high-frequency module 1A according to Example 1. FIG. 3 is a plan view of a major surface 91b of the high-frequency module 1A according to Example 1. FIG. 3 is a view seen through the major surface 91b side of a module substrate 91 as seen in the positive z-axis direction. FIG. 4 is a plan view of a major surface 92b of the high-frequency module 1A according to Example 1. FIG. 4 is a view seen through the major surface 92b side of a module substrate 92 as seen in the positive z-axis direction. FIG. 5 is a cross-sectional view of the high-frequency module 1A according to Example 1. The cross section of the high-frequency module 1A in FIG. 5 is taken along a line v-v of FIGS. 2 to 4.

FIGS. 2 to 5 do not illustrate traces connecting plural electronic components disposed in the module substrates 91 and 92. FIGS. 2 to 4 do not illustrate resin members 93 to 95 covering plural electronic components and a shield electrode layer 96, which covers the surfaces of the resin members 93 to 95.

In addition to the plural electronic components including the plural circuit elements illustrated in FIG. 1, the high-frequency module 1A includes the module substrates 91 and 92, the resin members 93 to 95, the shield electrode layer 96, plural external connection terminals 150, and plural inter-substrate connection terminals 151.

The module substrate 91 is an example of a first module substrate and includes the major surfaces 91a and 91b, which are opposite to each other. The major surfaces 91a and 91b are examples of first and second major surfaces, respectively.

The module substrate 92 is an example of a second module substrate and includes the major surfaces 92a and 92b, which are opposite to each other. The major surfaces 92a and 92b are examples of third and fourth major surfaces, respectively.

The module substrates 91 and 92 are disposed so that the major surface 91b of the module substrate 91 faces the major surface 92a of the module substrate 92. The module substrates 91 and 92 are disposed at such a distance that the electronic components can be disposed between the major surfaces 91b and 92a. The plural electronic components are disposed in the two module substrates 91 and 92 and, specifically, are separated into three layers: between the major surfaces 91b and 92a; on the major surface 91a; and on the major surface 92b.

In the major surface 91a of the module substrate 91, a recess 80 is formed.

In FIGS. 2 to 5, the module substrates 91 and 92 have rectangular shapes of the same size in a planar view. The module substrates 91 and 92 may have different sizes and/or different shapes. The shapes of the module substrates 91 and 92 are not limited to rectangles.

Each of the module substrates 91 and 92 can be, but not limited to, a low temperature co-fired ceramic (LTCC) substrate or a high temperature co-fired ceramic (HTCC) substrate, which includes a laminate structure of plural dielectric layers, an embedded printed circuit board, a substrate including a redistribution layer (RDL), a printed circuit board, or the like, for example.

Within the module substrate 91, ground conductors 911 extended in the direction parallel to the major surfaces 91a and 91b may be formed. This improves isolation between the electronic components disposed on the major surface 91a and the electronic components disposed on the major surface 91b. Within the module substrate 92, ground conductors 921 extended in the direction parallel to the major surfaces 92a and 92b may be formed. This improves isolation between the electronic components disposed on the major surface 92a and the electronic components disposed on the major surface 92b.

The module substrate 91, in which the recess 80 is formed, is thicker than the module substrate 92. To be more specific, thickness t1 of the module substrate 91 in the direction (along the z-axis) vertical to the major surfaces 91a and 91b is greater than thickness t2 of the module substrate 92 in the direction (along the z-axis) vertical to the major surfaces 92a and 92b.

On the major surface 91a (the upper layer), the power amplifiers 11 and 12, matching networks 401, 411 to 413, 422, 431 to 433, 441 to 443, 452, and 461 to 463, and the filters 61 and 64 are disposed. In Example 1, each of the matching networks 401, 411, 431 to 433, 441, and 461 to 463 is an example of the first electronic component and is disposed in the recess 80, which is formed in the major surface 91a. On the other hand, the matching networks 412, 413, 422, 442, 443, and 452 is an example of the second electronic component and is disposed outside of the recess 80 on the major surface 91a. Herein, the second electronic component is shorter in height than the first electronic component (the height of the second electronic component along the z-axis is smaller than that of the first electronic component).

Each of the matching networks 401, 411 to 413, 422, 431 to 433, 441 to 443, 452, and 461 to 463 is composed of a chip inductor, for example. The chip inductors are surface mount devices (SMDs) each constituting an inductor.

Each of the matching networks 411, 431, 441, and 461 is an example of the first inductor coupled between the switch 51 and the first filter. Each of the matching networks 432, 433, 462, and 463 is an example of the second inductor coupled between the low-noise amplifier 21 or 22 and the second filter. Each of the matching networks 412, 413, 442, and 443 is an example of the third inductor coupled between the power amplifier 11 or 12 and the third filter.

Each matching network may include not only a chip inductor but also a chip capacitor, and the positions of the chip capacitors are not limited.

The power amplifiers 11 and 12 are composed of complementary metal oxide semiconductors (CMOSs), for example, and specifically, can be manufactured by a silicon-on-insulator (SOI) process. The power amplifiers 11 and 12 can be thereby manufactured at low cost. The power amplifiers 11 and 12 may be composed of at least one of gallium arsenide (GaAs), silicon germanium (SiGe), and gallium nitride (GaN). This can implement the power amplifiers 11 and 12 of high quality. The semiconductor materials of the power amplifiers 11 and 12 are not limited to the aforementioned materials.

The filter 61 is an example of the first filter and an example of the third filter. The filter 61 may be composed of, but not limited to, any one of a surface acoustic wave (SAW) filter, a bulk acoustic wave (BAW) filter, an LC resonance filter, and a dielectric filter, for example. The filter 64 is an example of the first filter and an example of the third filter and may be composed of, but not limited to, any one of a SAW filter, a BAW filter, an LC resonance filter, and a dielectric filter, for example.

The resin member 93 covers the major surface 91a and the electronic components on the major surface 91a. The resin member 93 has a function of enhancing the reliability, including mechanical strength and moisture resistance, of the electronic components on the major surface 91a. The resin member 93 does not need to be included in the high-frequency module 1A.

Between the major surfaces 91b and 92a (the middle layer), the filters 62, 63, 65, and 66 and the plural inter-substrate connection terminals 151 are disposed. Between the major surfaces 91b and 92a, the resin member 94 is injected and covers the electronic components disposed between the major surfaces 91b and 92a.

Each of the filters 62, 63, 65, and 66 is an example of the first filter and may be composed of, but not limited to, any one of a SAW filter, a BAW filter, an LC resonance filter, and a dielectric filter, for example.

Each of the plural electronic components (herein, the filters 62, 63, 65, and 66) disposed between the major surfaces 91b and 92a is provided with electrodes on the side facing the module substrate 91 and is electrically coupled to the module substrate 91 with the electrodes interposed therebetween. Each of the plural electronic components (herein, the filters 62, 63, 65, and 66) disposed between the major surfaces 91b and 92a may be provided with electrodes on the side facing the module substrate 92 and may be electrically coupled to the module substrate 92 with the electrodes interposed therebetween.

The plural inter-substrate connection terminals 151 are electrodes for electrically coupling the module substrates 91 and 92. Some of the inter-substrate connection terminals 151 overlap the power amplifier 11 or 12 in a planar view and are coupled to the external connection terminals 150 to serve as heat dissipation electrodes of the power amplifiers 11 and 12. The inter-substrate connection terminals 151 are composed of copper post electrodes, for example. The shape and material of the inter-substrate connection terminals 151 are not limited thereto.

The resin member 94 covers the major surfaces 91b and 92a and the electronic components between the major surfaces 91b and 92a. The resin member 94 has a function of enhancing the reliability, including mechanical strength and moisture resistance, of the electronic components between the major surfaces 91b and 92a. The resin member 94 does not need to be included in the high-frequency module 1A.

On the major surface 92b (the lower layer), integrated circuits 20 and 70, a switch 51, and the plural external connection terminals 150 are disposed.

The integrated circuit 20 includes the low-noise amplifiers 21 and 22 and switches 53 and 55. The circuit elements constituting the low-noise amplifiers 21 and 22 and the switches 53 and 55 are formed in the circuit surface of the integrated circuit 20. The circuit surface is, for example, a major surface of the integrated circuit 20 that faces the module substrate 92. The integrated circuit 70 includes the switches 52 and 54 and the PA controller 71. The circuit elements constituting the switches 52 and 54 and the PA controller 71 are formed in the circuit surface of the integrated circuit 70. The circuit surface is, for example, a major surface of the integrated circuit 70 that faces the module substrate 92. The integrated circuit 50 includes the switch 51. The switch 51 may be included in the integrated circuit 20 or 70.

Each of the integrated circuits 20, 50, and 70 is composed of a CMOS, for example, and specifically, may be manufactured by a SOI process. Each of the integrated circuits 20, 50, and 70 may be composed of at least one of GaAs, SiGe, and GaN. The semiconductor materials of the integrated circuits 20, 50, and 70 are not limited to the aforementioned materials.

The circuit element constituting the switch 51 is formed in the circuit surface of the switch device. The circuit surface is, for example, a major surface of the switch device that faces the module substrate 92. The switch 51 may be composed of a CMOS, for example, and specifically, may be manufactured by a SOI process. The switch 51 may be composed of at least one of GaAs, SiGe, and GaN. The semiconductor material of the switch 51 is not limited to the aforementioned materials. The switch 51 may be included in the integrated circuit 20.

As described above, the electronic components (herein, the integrated circuits 20 and 70 and the switch 51) including at least a transistor are disposed on the major surface 92b. The electronic components (herein, the filters 61 to 66 and the matching networks (the chip inductors) 401, 411 to 413, 422, 431 to 433, 441 to 443, 452, and 461 to 463) not including any transistor are not disposed on the major surface 92b. The lower surface of the high-frequency module 1A can be formed by cutting, and the thicknesses of the resin member 95, the integrated circuits 20 and 70, and the switch 51 can be reduced.

The plural external connection terminals 150 include the antenna connection terminal 100, high-frequency input terminals 111 and 112, high-frequency output terminals 121 and 122, and control terminal 131, which are illustrated in FIG. 1, and further include ground terminals. The plural external connection terminals 150 are individually joined to input-output terminals, a ground terminal, and/or other terminals on a motherboard 1000, which is laid in the negative z-axis direction with respect to the high-frequency module 1A. The plural external connection terminals 150 can be copper post electrodes, for example. However, the shape and material of the external connection terminals 150 are not limited thereto. Some of the plural external connection terminals 150 overlap the power amplifier 11 or 12 in a planar view and serve as heat dissipation electrodes of the power amplifiers 11 and 12 together with the inter-substrate connection terminals 151 coupled to the power amplifiers 11 and 12.

The resin member 95 covers the major surface 92b and the electronic components on the major surface 92b. The resin member 95 has a function of enhancing the reliability, including mechanical strength and moisture resistance, of the electronic components on the major surface 92b. The resin member 95 does not need to be included in the high-frequency module 1A.

The shield electrode layer 96 is a metallic thin film formed by sputtering, for example. The shield electrode layer 96 is formed so as to cover the upper surface of the resin member 93 and lateral faces of the resin members 93 to 95 and module substrates 91 and 92. The shield electrode layer 96 is coupled to the ground and inhibits external noise from entering the electronic components constituting the high-frequency module 1A. The shield electrode layer 96 does not need to be included in the high-frequency module 1A.

In the high-frequency module 1A according to Example 1, the module substrate 91, in which the recess 80 is formed, is disposed farther from the motherboard 1000 than the module substrate 92. However, the module substrate 91, in which the recess 80 is formed, may be disposed closer to the motherboard 1000 than the module substrate 92.

[2.1.2 Effect of High-Frequency Module 1A]

As described above, the high-frequency module 1A according to Example 1 includes: the module substrate 91, which includes the major surfaces 91a and 91b opposite to each other; the module substrate 92, which includes the major surfaces 92a and 92b opposite to each other, the major surface 92a being disposed facing the major surface 91b; the plural electronic components disposed between the major surfaces 91b and 92a, on the major surfaces 91a, and on the major surface 92b; and plural external connection terminals 150, which are disposed on the major surface 92b. In the major surface 91a of the module substrate 91, the recess 80 is formed. The plural electronic components include: the first electronic component (the matching networks 401, 411, 431 to 433, 441, and 461 to 463); and the second electronic component (the matching networks 412, 413, 422, 442, 443, and 452), which is shorter in height than the first electronic component. The first electronic component is disposed in the recess 80, and the second electronic component is disposed in a region outside of the recess 80 on the major surface 91a.

According to such a configuration, the plural electronic components are disposed in three layers, including between the major surfaces 91b and 92a, on the major surface 91a, and on the major surface 92b. This can implement reduction in area of the high-frequency module 1A in a planar view, that is, reduction in size of the high-frequency module 1A. Furthermore, the height of the first electronic component is larger in height than the second electronic component. The first electronic component is therefore disposed in the recess 80 of the module substrate 91 while the second electronic component is disposed outside of the recess 80 in the major surface 91a. The electronic components disposed on the major surface 91a can thereby be aligned in height. This can minimize the height of the high-frequency module 1A.

In the high-frequency module 1A according to Example 1, for example, the aforementioned plural electronic components may include: the first filter; the switch 51, which switches whether to couple the antenna connection terminal 100 to the first filter; and the first inductor coupled between the switch 51 and the first filter. The first electronic component may be the first inductor.

In the light of enhancing isolation between the electronic components coupled to the input and output sides of each matching network to improve the transmission characteristics of the high-frequency module 1A, the first inductor requires a high Q factor among the matching networks. Inductors that require a high Q factor need to have a large volume, thus increasing in height. In order to minimize the height of the high-frequency module 1A, the first inductor (the first electronic component) is disposed in the recess 80 of the module substrate 91, and the second electronic component, which does not require a high Q factor, is disposed outside of the recess 80 in the major surface 91*a*. This can minimize the height of the high-frequency module 1A without degrading the transmission characteristics of the high-frequency module 1A.

In the high-frequency module 1A according to Example 1, for example, the recess 80 is formed in the major surface 91*a*. The first filter may be disposed in any one of the major surface 91*a*, the major surface 91*b*, and the major surface 92*a*, and the switch 51 may be disposed in the major surface 92*b*.

In the high-frequency module 1A according to Example 1, for example, the aforementioned plural electronic components may include the second filter, the low-noise amplifiers 21 and/or 22, and the second inductor coupled between the low-noise amplifiers 21 and/or 22 and the second filter. The first electronic component may be the second inductor.

In the light of enhancing isolation between the electronic components coupled to the input and output sides of each matching network to minimize degradation of the receiver sensitivity of the high-frequency module 1A, the second inductor requires a high Q factor among the matching networks. Inductors that require a high Q factor need to have a large volume, thus increasing in height. In order to minimize the height of the high-frequency module 1A, the second inductor (the first electronic component) is disposed in the recess 80 of the module substrate 91, and the second electronic component, which does not require a high Q factor, is disposed outside of the recess 80 in the major surface 91*a*. This can minimize the height of the high-frequency module 1A without degrading the receiver sensitivity of the high-frequency module 1A.

In the high-frequency module 1A according to Example 1, for example, the recess 80 is formed in the major surface 91*a*. The second filter may be disposed in any one of the major surface 91*a*, the major surface 91*b*, and the major surface 92*a*, and the low-noise amplifiers 21 and/or 22 may be disposed in the major surface 92*b*.

In the high-frequency module 1A according to Example 1, for example, the module substrate 91 may be thicker than the module substrate 92, and the recess 80 may be formed in the module substrate 91.

According to such a configuration, since the module substrate 91, in which the recess 80 is formed, is thicker than the module substrate 92, and the recess 80 can be made deep enough. It is therefore possible to minimize the height of the high-frequency module 1A even when the first electronic component of large height is disposed in the recess 80.

The communication device 5 according to Example 1 includes: the RFIC 3, which processes high-frequency signals; and the high-frequency module 1A that transfers the high-frequency signals between the RFIC 3 and the antenna 2.

According to such a configuration, the effects of the high-frequency module 1A can be implemented in the communication device 5.

2.2 Example 2

Next, a high-frequency module 1B, in which the high-frequency circuit 1 is implemented, is described as Example 2 of the high-frequency circuit 1 according to the aforementioned exemplary embodiment. Example 2 is different from Example 1 described above mostly in that the matching networks 411, 431, 441, and 461 (the first inductor) are disposed within the module substrate 91. The following description of the high-frequency module 1B according to Example 2 focuses different points from Example 1 with reference to FIG. 6.

[2.2.1 Component Position of High-Frequency Module 1B]

Figure 6:
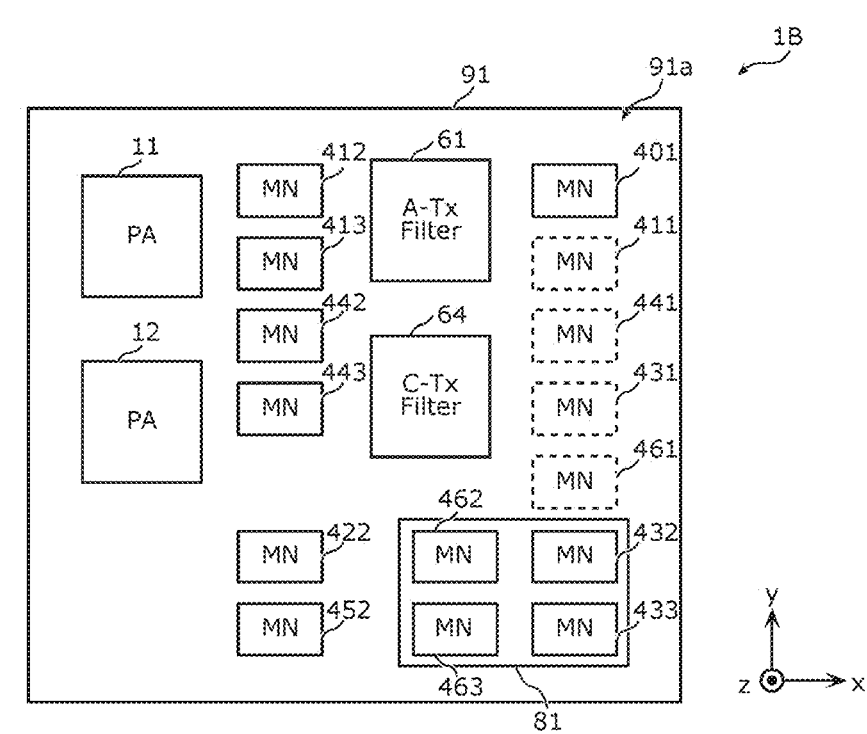
FIG. 6 is a plan view of a first major surface of a high-frequency module according to Example 2.

FIG. 6 is a plan view of a major surface 91*a* of the high-frequency module 1B according to Example 2.

In the major surface 91*a* of the module substrate 91, a recess 81 is formed.

The module substrate 91, in which the recess 81 is formed, is thicker than the module substrate 92.

On the major surface 91*a* (the upper layer), the power amplifiers 11 and 12, matching networks 401, 412, 413, 422, 432, 433, 442, 443, 452, 462, and 463, and filters 61 and 64 are disposed.

In Example 2, each of the matching networks 432, 433, 462, and 463 is an example of the second inductor coupled between the low-noise amplifier 21 or 22 and the second filter and is disposed in the recess 81, which is formed in the major surface 91*a*. Each of the matching networks 432, 433, 462, and 463 is the first electronic component.

Each of the matching networks 412, 413, 422, 442, 443, and 452 is an example of the second electronic component and is disposed outside of the recess 81 on the major surface 91*a*. Herein, the second electronic component is shorter in height than the first electronic component (the height of the second electronic component along the z-axis is larger than that of the first electronic component).

Each of the matching networks 411, 431, 441, and 461 is an example of the first inductor coupled between the switch 51 and the first filter and is disposed within the module substrate 91.

Each of the matching networks 401, 412, 413, 422, 432, 433, 442, 443, 452, 462, and 463 is composed of a chip inductor, for example. The chip inductors are surface mount devices (SMDs) each constituting an inductor. On the other hand, each of the matching networks 411, 431, 441, and 461 is composed of a coil conductor formed by layering in the direction vertical to the major surfaces 91*a* and 91*b* within the module substrate 91, plural conductor patterns extended in the direction parallel to the major surfaces 91*a* and 91*b*.

Each matching network may include not only a chip inductor but also a chip capacitor, and the positions of the chip capacitors are not limited.

In the high-frequency module 1B according to Example 1, the module substrate 91, in which the recess 81 is formed, is disposed farther from the motherboard 1000 than the module substrate 92. However, the module substrate 91, in which the recess 81 is formed, may be disposed closer to the motherboard 1000 than the module substrate 92.

[2.2.2 Effect of High-Frequency Module 1B]

As described above, the high-frequency module 1B according to Example 2 includes: the module substrate 91, which includes the major surfaces 91*a* and 91*b* opposite to each other; the module substrate 92, which includes the major surfaces 92*a* and 92*b* opposite to each other, the major surface 92*a* being disposed facing the major surface 91*b*; the plural electronic components disposed between the major surfaces 91*b* and 92*a*, on the major surface 91*a*, and on the major surface 92*b*; and the plural external connection terminals 150, which are disposed on the major surface 92*b*. In the major surface 91*a* of the module substrate 91, the recess 81 is formed. The plural electronic components include the first electronic component (the matching networks 432, 433, 462, and 463) and the second electronic component (the matching networks 412, 413, 422, 442, 443, and 452), which is shorter in height than the first electronic component. The first electronic component is disposed in the recess 81, and the second electronic component is disposed in a region outside of the recess 81 on the major surface 91*a*.

According to such a configuration, the plural electronic components are disposed in three layers, including between the major surfaces 91*b* and 92*a*, on the major surface 91*a*, and on the major surface 92*b*. This can implement reduction in area of the high-frequency module 1B in a planar view, that is, reduction in size of the high-frequency module 1B. Furthermore, the height of the first electronic component is larger than that of the second electronic component. The first electronic component is therefore disposed in the recess 81 of the module substrate 91 while the second electronic component is disposed outside of the recess 81 in the major surface 91*a*. The electronic components disposed on the major surface 91*a* can thereby be aligned in height. This can minimize the height of the high-frequency module 1B.

In the high-frequency module 1B according to Example 2, for example, the aforementioned plural electronic components may include: the first filter and second filter; the low-noise amplifiers 21 and/or 22; the switch 51, which switches whether to couple the antenna connection terminal 100 to the first filter; and the second inductor coupled between the low-noise amplifiers 21 and/or 22 and the second filter. The first electronic component may be the second inductor. The high-frequency module 1B may further include the first inductor coupled between the switch 51 and the first filter, and the first inductor may be disposed within the module substrate 91.

In the light of enhancing isolation between the electronic components coupled to the input and output sides of each matching network to minimize degradation of the receiver sensitivity of the high-frequency module 1B, the second inductor requires a high Q factor among the matching networks. Inductors that require a high Q factor need to have a large volume, thus increasing in height. In order to minimize the height of the high-frequency module 1B, the second inductor (the first electronic component) is disposed in the recess 80 of the module substrate 91, and the second electronic component, which does not require a high Q factor, is disposed outside of the recess 80 in the major surface 91*a*.

In the light of enhancing isolation between the electronic components coupled to the input and output sides of each matching network to improve the transmission characteristics of the high-frequency module 1B, among the matching networks constituting the high-frequency module 1B, the first inductor coupled between the switch 51 and the first filter requires a high Q factor. In order to reduce the size of the high-frequency module 1B, it is desirable to dispose the first inductor within the module substrate 91. Furthermore, in order to implement a high Q factor, it is desirable to increase the number of windings (the number of layered conductor patterns) of the coil conductor constituting the first inductor and increase the distance between the coil conductor and the ground conductor patterns within the module substrate 91. In order to implement this, it is desirable to increase the substrate thickness of the module substrate 91 within which the first inductor is embedded and disposed. Since the module substrate 91 is thick enough for the recess 81 to be formed, the Q factor of the first inductor can be increased. It is therefore possible to reduce the size of the high-frequency module 1A while minimizing degradation of the receiver sensitivity and degradation of the transmission characteristics.

The communication device 5 according to Example 2 includes the RFIC 3, which processes high-frequency signals; and the high-frequency module 1B, which transfers high-frequency signals between the RFIC 3 and the antenna 2.

According to such a configuration, the effects of the high-frequency module 1B can be implemented in the communication device 5.

2.3 Example 3

Next, a high-frequency module 1C, in which the high-frequency circuit 1 is implemented, is described as Example 3 of the high-frequency circuit 1 according to the aforementioned exemplary embodiment. Example 3 is different from Example 1 described above mostly in that a recess 82 is formed in the major surface 91*b*. The following description of the high-frequency module 1C according to Example 3 focuses different points from Example 1 with reference to FIGS. 7 to 10.

[2.3.1 Component Position of High-Frequency Module 1C]

Figure 7:
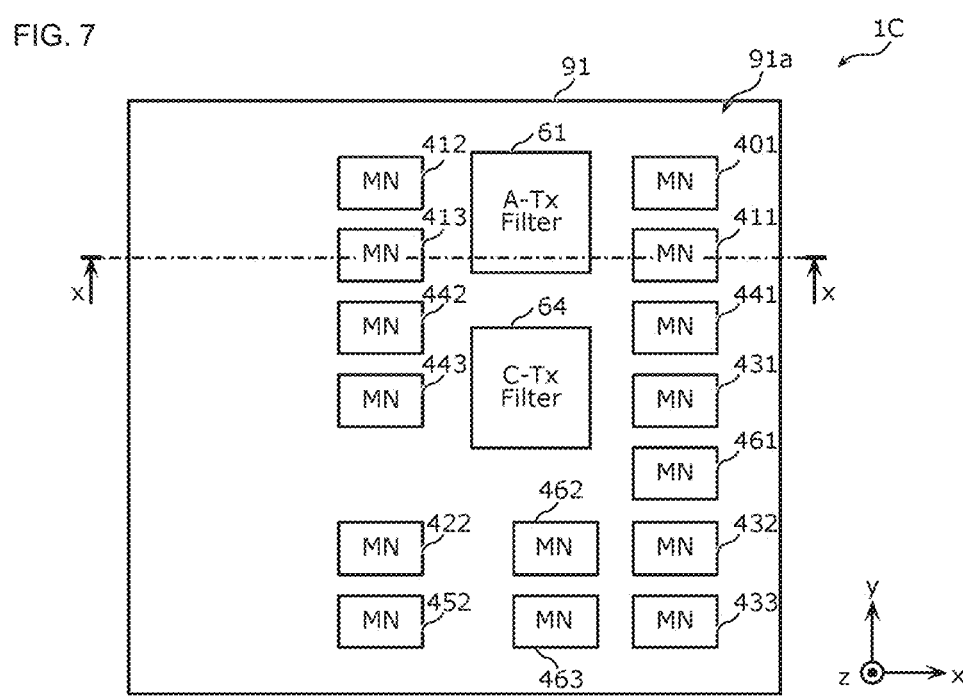
FIG. 7 is a plan view of a first major surface of the high-frequency module according to Example 3.
Figure 8:
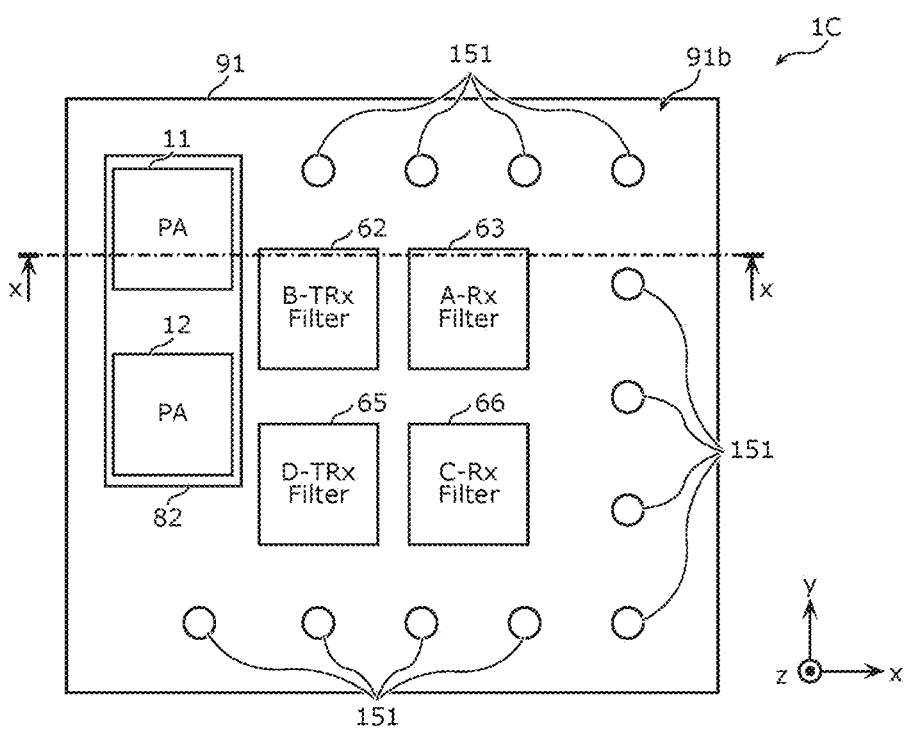
FIG. 8 is a plan view of a second major surface of the high-frequency module according to Example 3.
Figure 9:
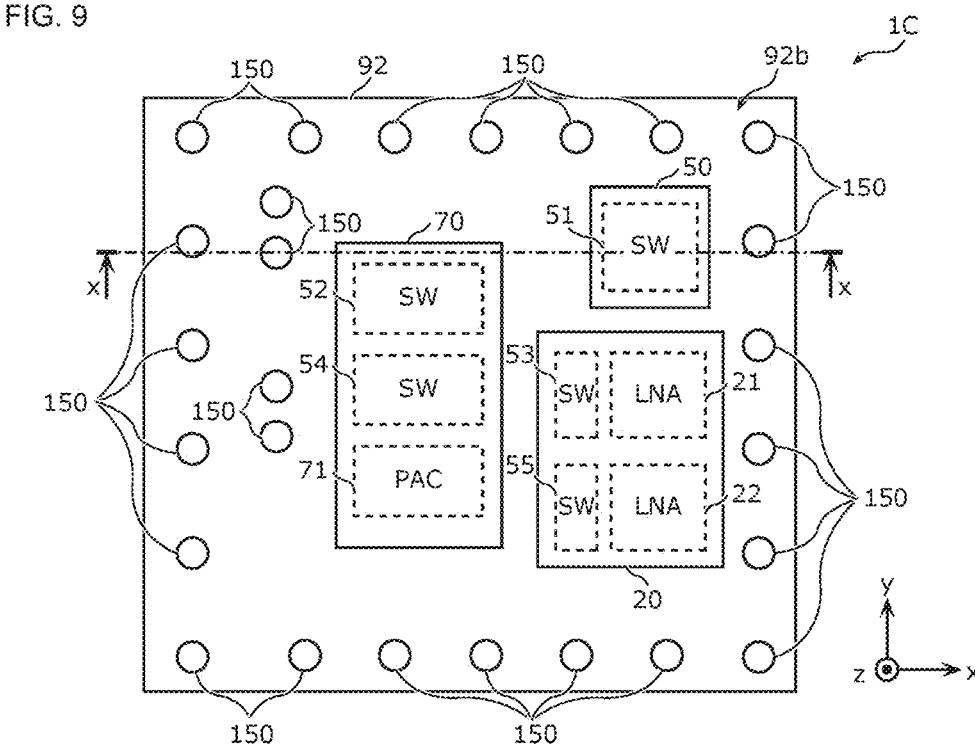
FIG. 9 is a plan view of a fourth major surface of the high-frequency module according to Example 3.
Figure 10:
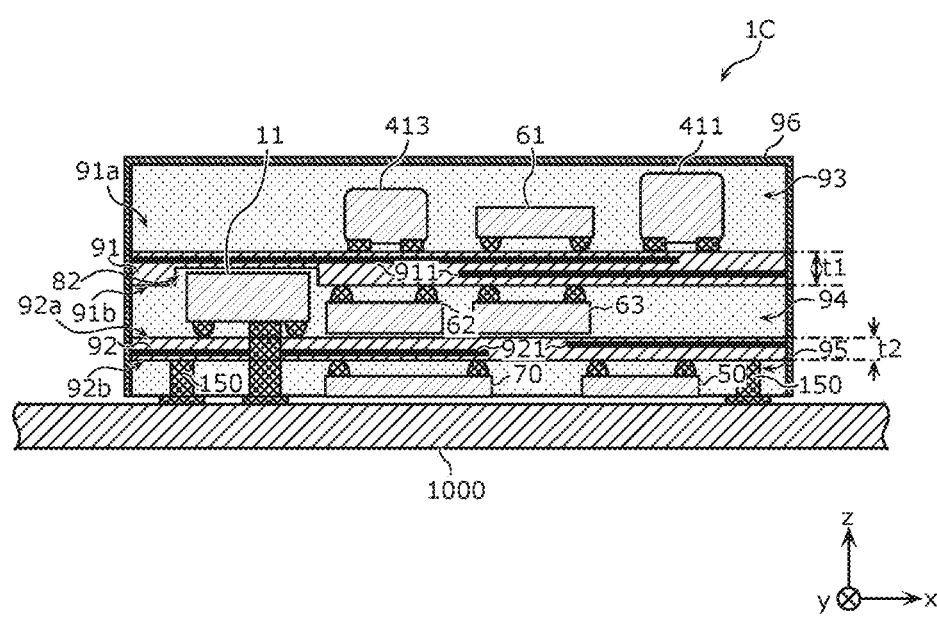
FIG. 10 is a cross-sectional view of the high-frequency module according to Example 3.

FIG. 7 is a plan view of the major surface 91*a* of the high-frequency module 1C according to Example 3. FIG. 8 is a plan view of the major surface 91*b* of the high-frequency module 1C according to Example 3. FIG. 8 is a view seen through the major surface 91*b* side of the module substrate 91 as seen in the positive z-axis direction. FIG. 9 is a plan view of the major surface 92*b* of the high-frequency module 1C according to Example 3. FIG. 9 is a view seen through the major surface 92*b* side of the module substrate 92 as seen in the positive z-axis direction. FIG. 10 is a cross-sectional view of the high-frequency module 1C according to Example 3. The cross section of the high-frequency module 1C in FIG. 10 is taken along a line x-x of FIGS. 7 to 9.

In the major surface 91*b* of the module substrate 91, the recess 82 is formed.

The module substrate 91, in which the recess 82 is formed, is thicker than the module substrate 92. To be more specific, the thickness t1 of the module substrate 91 in the direction (along the z-axis) vertical to the major surfaces 91*a* and 91*b* is greater than the thickness t2 of the module substrate 92 in the direction (along the z-axis) vertical to the major surfaces 92*a* and 92*b*.

On the major surface 91*a* (the upper layer), the matching networks 401, 411 to 413, 422, 431 to 433, 441 to 443, 452, and 461 to 463 and the filters 61 and 64 are disposed.

Each of the matching networks 401, 411 to 413, 422, 431 to 433, 441 to 443, 452, and 461 to 463 is composed of a chip inductor, for example. The chip inductors are surface mount devices (SMDs) each constituting an inductor.

Each of the matching networks 411, 431, 441, and 461 is an example of the first inductor coupled between the switch 51 and the first filter, and the matching networks 432, 433, 462, and 463 is an example of the second inductor coupled between the low-noise amplifiers 21 or 22 and the second filter. The matching networks 412, 413, 442, and 443 is an example of a third inductor coupled between the power amplifier 11 or 12 and the third filter.

Each matching network may include not only a chip inductor but also a chip capacitor, and the positions of the chip capacitors are not limited.

The filter 61 is an example of the first filter and an example of the third filter. The filter 61 may be composed of, but not limited to, any one of a surface acoustic wave (SAW) filter, a bulk acoustic wave (BAW) filter, an LC resonance filter, and a dielectric filter, for example. The filter 64 is an example of the first filter and an example of the third filter and may be composed of, but not limited to, any one of a SAW filter, a BAW filter, an LC resonance filter, and a dielectric filter, for example.

Between the major surfaces 91*b* and 92*a* (the middle layer), the power amplifiers 11 and 12, filters 62, 63, 65, and 66, and plural inter-substrate connection terminals 151 are disposed. The resin member 94 is injected into between the major surfaces 91*b* and 92*a* and covers the electronic components disposed between the major surfaces 91*b* and 92*a*.

The power amplifiers 11 and 12 are provided with electrodes on the side facing the module substrate 92 and are electrically coupled to the module substrate 92 with the electrodes interposed therebetween. The circuit surface of each of the power amplifiers 11 and 12 is a major surface facing the module substrate 92, for example. This can minimize the length of the heat dissipation electrode coupling the circuit surface and the corresponding external connection terminals 150, thus increasing the heat dissipation. The power amplifiers 11 and 12 may be composed of a CMOS, for example, and specifically, may be manufactured by a SOI process. The power amplifiers 11 and 12 can thereby be manufactured at low cost. The power amplifiers 11 and 12 may be composed of at least one of GaAs, SiGe, and GaN. This can implement the power amplifiers 11 and 12 of high quality. The semiconductor material of the power amplifiers 11 and 12 is not limited to the aforementioned materials.

Each of the filters 62, 63, 65, and 66 is an example of the first filter and may be composed of, but not limited to, any one of a SAW filter, a BAW filter, an LC resonance filter, and a dielectric filter, for example.

Each of the plural electronic components (herein, the filters 62, 63, 65, and 66) disposed between the major surfaces 91*b* and 92*a* is provided with electrodes on the side facing the module substrate 91 and is electrically coupled to the module substrate 91 with the electrodes interposed therebetween. Each of the plural electronic components (herein, the filters 62, 63, 65, and 66) disposed between the major surfaces 91*b* and 92*a* may be provided with electrodes on the side facing the module substrate 92 and may be electrically coupled to the module substrate 92 with the electrodes interposed therebetween.

The plural inter-substrate connection terminals 151 are electrodes electrically coupling the module substrates 91 and 92.

In Example 3, each of the power amplifiers 11 and 12 is an example of the first electronic component, and the tops of the power amplifiers 11 and 12 are disposed in the recess 82, which is formed in the major surface 91*b*. Each of the filters 62 and 63 is an example of the second electronic component and is disposed outside of the recess 82 on the major surface 91*b*. Herein, the second electronic component is shorter in height than the first electronic component (the height of the second electronic component along the z-axis is smaller than that of the first electronic component).

On the major surface 92*b* (the lower layer), the integrated circuits 20 and 70, switch 51, and plural external connection terminals 150 are disposed.

The plural external connection terminals 150 include the antenna connection terminal 100, high-frequency input terminals 111 and 112, high-frequency output terminals 121 and 122, and control terminal 131, which are illustrated in FIG. 1, and further include ground terminals. The plural external connection terminals 150 are individually joined to input-output terminals, ground terminals, and/or other terminals on the motherboard 1000, which is laid in the negative z-axis direction with respect to the high-frequency module 1C. The plural external connection terminals 150 can be copper post electrodes, for example. However, the shape and material of the external connection terminals 150 are not limited thereto. Some of the plural external connection terminals 150 overlap the power amplifier 11 or 12 in a planar view and serve as heat dissipation electrodes of the power amplifiers 11 and 12.

In the high-frequency module 1C according to Example 3, the module substrate 91, in which the recess 82 is formed, is disposed farther from the motherboard 1000 than the module substrate 92. However, the module substrate 91, in which the recess 82 is formed, may be disposed closer to the motherboard 1000 than the module substrate 92.

[2.3.2 Effect of High-Frequency Module 1C]

As described above, the high-frequency module 1C according to Example 3 includes: the module substrate 91, which includes the major surfaces 91*a* and 91*b* opposite to each other; the module substrate 92, which includes the major surfaces 92*a* and 92*b* opposite to each other, the major surface 92*a* being disposed facing the major surface 91*b*; the plural electronic components disposed between the major surfaces 91*b* and 92*a*, on the major surface 91*a*, and on the major surface 92*b*; and the plural external connection terminals 150, which are disposed on the major surface 92*b*. In the major surface 91*b* of the module substrate 91, the recess 82 is formed. The plural electronic components include the first electronic component (the power amplifiers 11 and/or 12) and the second electronic component (the filters 62 and/or 63), which is shorter in height than the first electronic component. The first electronic component is disposed in the recess 82, and the second electronic component is disposed in a region outside of the recess 82 on the major surface 91*b*.

According to such a configuration, the plural electronic components are disposed in three layers, including between the major surfaces 91*b* and 92*a*, on the major surface 91*a*, and on the major surface 92*b*. This can implement reduction in area of the high-frequency module 1C in a planar view, that is, reduction in size of the high-frequency module 1C. Furthermore, the height of the first electronic component is larger than that of the second electronic component. The first electronic component is therefore disposed in the recess 82 of the module substrate 91 while the second electronic component is disposed outside of the recess 82 in the major surface 91*b*. The electronic components disposed between the major surfaces 91*a* and 91*b* can thereby be aligned in height. This can minimize the height of the high-frequency module 1C.

In the high-frequency module 1C according to Example 3, for example, the plural electronic components may include the power amplifiers 11 and/or 12, the third filter, and the third inductor coupled between the power amplifiers 11 and/or 12 and the third filter. The first electronic component may be the power amplifiers 11 and/or 12.

In the light of enhancing heat dissipation and improving the transmission signal quality, power amplifiers generating transmission signals of high power need to have a large volume, thus increasing in height. In order to minimize the height of the high-frequency module 1C, therefore, the power amplifiers (the first electronic component) are disposed in the recess 82 of the module substrate 91, and the second electronic component is disposed outside of the recess 82 in the major surface 91*b*. This can reduce the size of the high-frequency module 1C while minimizing degradation of the transmission characteristics.

In the high-frequency module 1C according to Example 3, for example, the recess 82 is formed in the major surface 91*b*, and the power amplifiers 11 and/or 12 may be disposed in the major surface 91*b*. The third filter may be disposed in any one of the major surfaces 91*a*, 91*b*, and 92*a*, and the third inductor may be disposed in the major surface 91*a*.

This can shorten the dissipation electrodes coupling the power amplifiers 11 and/or 12 and the corresponding external connection terminals 150, thus increasing the heat dissipation.

The communication device 5 according to Example 3 includes the RFIC 3, which processes high-frequency signals; and the high-frequency module 1C, which transfers high-frequency signals between the RFIC 3 and the antenna 2.

According to such a configuration, the effects of the high-frequency module 1C can be implemented in the communication device 5.

2.4 Example 4

Next, a high-frequency module 1D, in which the high-frequency circuit 1 is implemented, is described as Example 4 of the high-frequency circuit 1 according to the aforementioned exemplary embodiment. Example 4 is different from Example 3 described above mostly in that a recess 83 is formed in the major surface 91*b*. The following description of the high-frequency module 1D according to Example 4 focuses different points from Example 3 with reference to FIG. 11.

Figure 11:
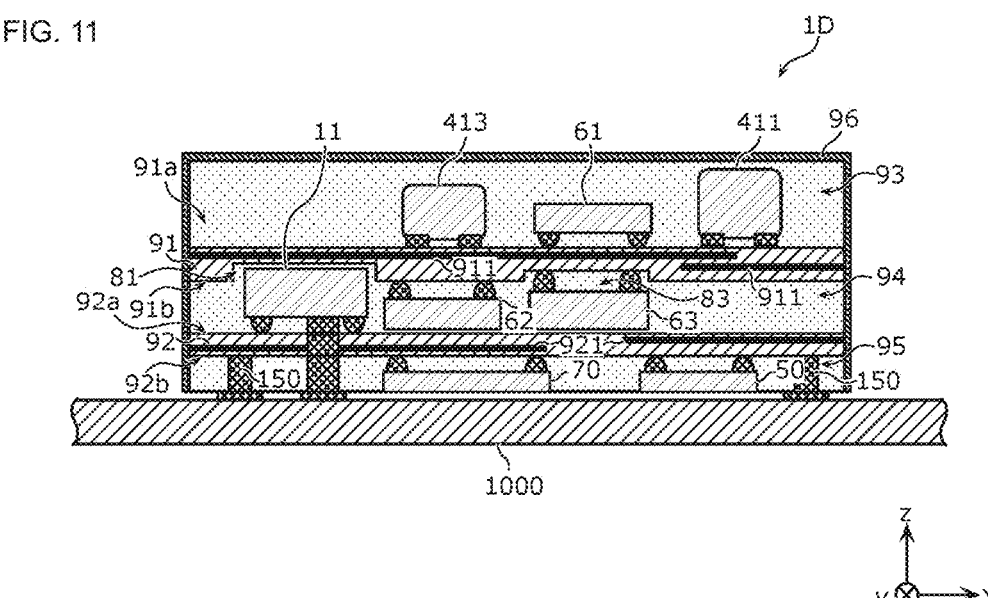
FIG. 11 is a cross-sectional view of a high-frequency module according to Example 4.

[2.4.1 Component Position of High-Frequency Module 1D]
FIG. 11 is a cross-sectional view of the high-frequency module 1D according to Example 4.

In the major surface 91*b* of the module substrate 91, the recess 83 is formed.

Between the major surfaces 91*b* and 92*a* (the middle layer), the power amplifiers 11 and 12, filters 62, 63, 65, and 66, and plural inter-substrate connection terminals 151 are disposed. The resin member 94 is injected into between the major surfaces 91*b* and 92*a* and covers the electronic components disposed between the major surfaces 91*b* and 92*a*.

The filter 63 is an example of a fourth filter and includes a filter body and electrode terminals.

Each of the plural electronic components (herein, the filters 62, 63, 65, and 66) disposed between the major surfaces 91*b* and 92*a* is provided with electrodes on the side facing the module substrate 91 and is electrically coupled to the module substrate 91 with the electrodes interposed therebetween. Each of the plural electronic components (herein, the filters 62, 63, 65, and 66) disposed between the major surfaces 91*b* and 92*a* may be provided with electrodes on the side facing the module substrate 92 and may be electrically coupled to the module substrate 92 with the electrodes interposed therebetween.

The plural inter-substrate connection terminals 151 are electrodes electrically coupling the module substrate 91 and 92.

In Example 4, the filter 63 is an example of the first electronic component. The electrode terminals of the filter 63 are joined to the bottom surface of the recess 83, which is formed in the major surface 91*b*. The filter body of the filter 63 does not need to be within the recess 83 in a planar view of the major surface 91*b*. The filter 62 is an example of the second electronic component and is disposed outside of the recesses 82 and 83 on the major surface 91*b*. Herein, the second electronic component is shorter in height than the first electronic component (the height of the second electronic component along the z-axis is smaller than that of the first electronic component).

In the high-frequency module 1D according to Example 4, the module substrate 91, in which the recess 83 is formed, is disposed farther from the motherboard 1000 than the module substrate 92. However, the module substrate 91, in which the recess 83 is formed, may be disposed closer to the motherboard 1000 than the module substrate 92.

In the module substrate 91, in which the recess 83 is formed, the recess 82 does not need to be formed.
[2.4.2 Effect of High-Frequency Module 1D]
As described above, the high-frequency module 1D according to Example 4 includes: the module substrate 91, which includes the major surfaces 91*a* and 91*b* opposite to each other; the module substrate 92, which includes the major surfaces 92*a* and 92*b* opposite to each other, the major surface 92*a* being disposed facing the major surface 91*b*; the plural electronic components disposed between the major surfaces 91*b* and 92*a*, on the major surface 91*a*, and on the major surface 92*b*; and the plural external connection terminals 150, which are disposed on the major surface 92*b*. In the major surface 91*b* of the module substrate 91, the recess 83 is formed. The plural electronic components include the first electronic component (the filter 63) and the second electronic component (the filter 62), which is shorter in height than the first electronic component. At least a part of the first electronic component is disposed in the recess 83, and the second electronic component is disposed in a region outside of the recess 83 on the major surface 91*b*.

According to such a configuration, the plural electronic components are disposed in three layers, including between the major surfaces 91*b* and 92*a*, on the major surface 91*a*, and on the major surface 92*b*. This can implement reduction in area of the high-frequency module 1D in a planar view, that is, reduction in size of the high-frequency module 1D. Furthermore, the height of the first electronic component is larger than that of the second electronic component. The first electronic component is therefore disposed in the recess 83 of the module substrate 91 while the second electronic component is disposed outside of the recess 83 in the major surface 91*b*. The electronic components disposed between the major surfaces 91*a* and 91*b* can thereby be aligned in height. This can minimize the height of the high-frequency module 1D.

In the high-frequency module 1D according to Example 4, for example, the plural electronic components may include the fourth filter including the filter body and electrode terminals. The first electronic component may be the fourth filter, and the electrode terminals of the fourth filter may be joined to the bottom surface of the recess 83.

In the light of the Q factor of resonators constituting a filter and the number thereof, the fourth filter needs to have a large volume, thus increasing in height. In order to minimize the height of the high-frequency module 1D, therefore, the fourth filter (the first electronic component) is disposed in the recess 83 of the module substrate 91, and the second electronic component is disposed outside of the recess 83 in the major surface 91*b*. This can reduce the size of the high-frequency module 1D while minimizing degradation of the transmission characteristics.

In the high-frequency module 1D according to Example 4, for example, the recess 83 may be formed in the major surface 91*b*.

The communication device 5 according to Example 4 includes the RFIC 3, which processes high-frequency signals; and the high-frequency module 1D, which transfers high-frequency signals between the RFIC 3 and the antenna 2.

According to such a configuration, the effects of the high-frequency module 1D can be implemented in the communication device 5.

2.5 Example 5

Next, a high-frequency module 1E, in which the high-frequency circuit 1 is implemented, is described as Example of the high-frequency circuit 1 according to the aforementioned embodiment. Example 5 is different from Example 1 described above mostly in that a recess 84 is formed in the major surface 92b. The following description of the high-frequency module 1E according to Example 5 focuses different points from Example 1 with reference to FIGS. 12 to 15.

[2.5.1 Component Position of High-Frequency Module 1E]

Figure 12:
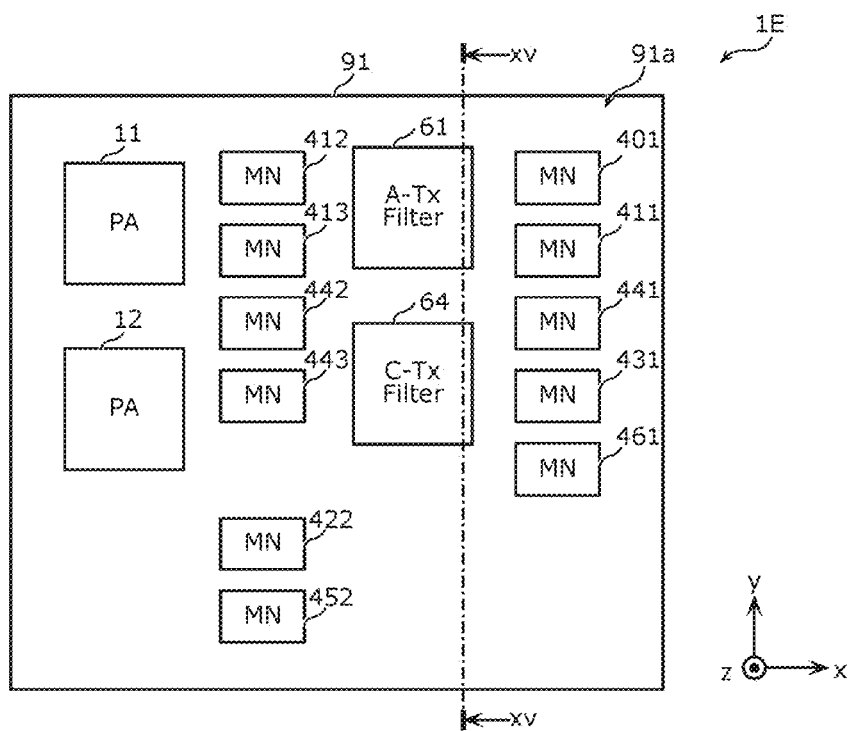
FIG. 12 is a plan view of a first major surface of a high-frequency module according to Example 5.
Figure 13:
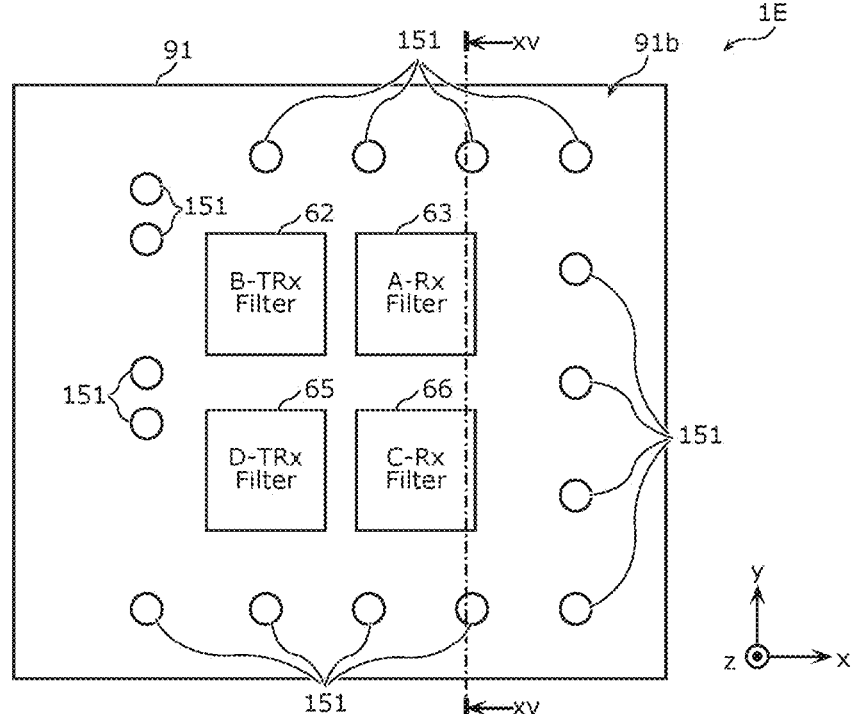
FIG. 13 is a plan view of a second major surface of the high-frequency module according to Example 5.
Figure 14:
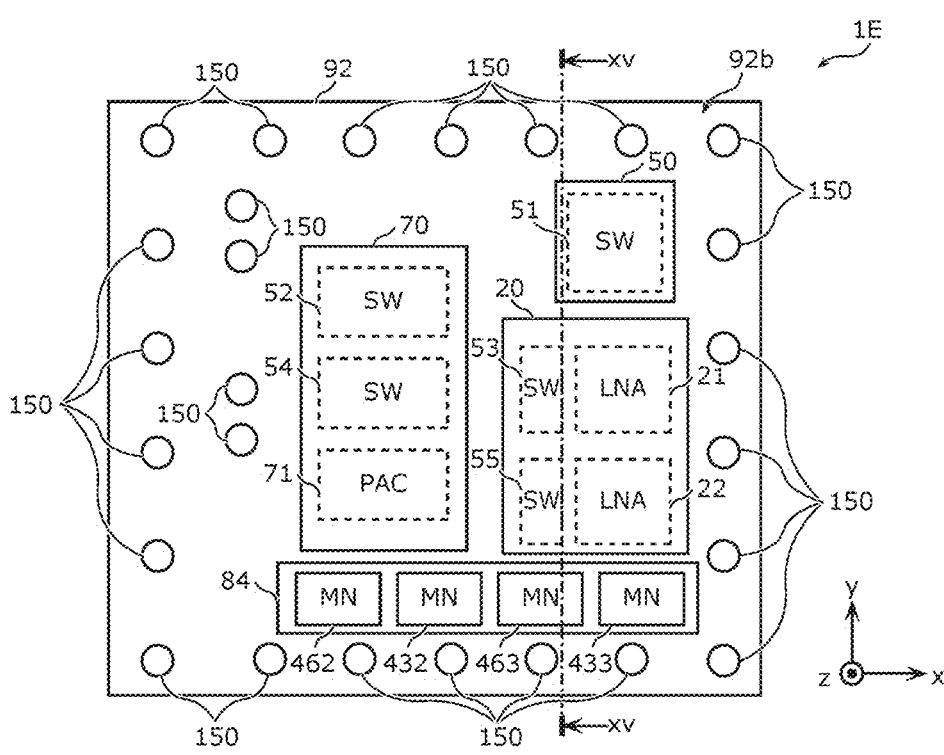
FIG. 14 is a plan view of a fourth major surface of the high-frequency module according to Example 5.
Figure 15:
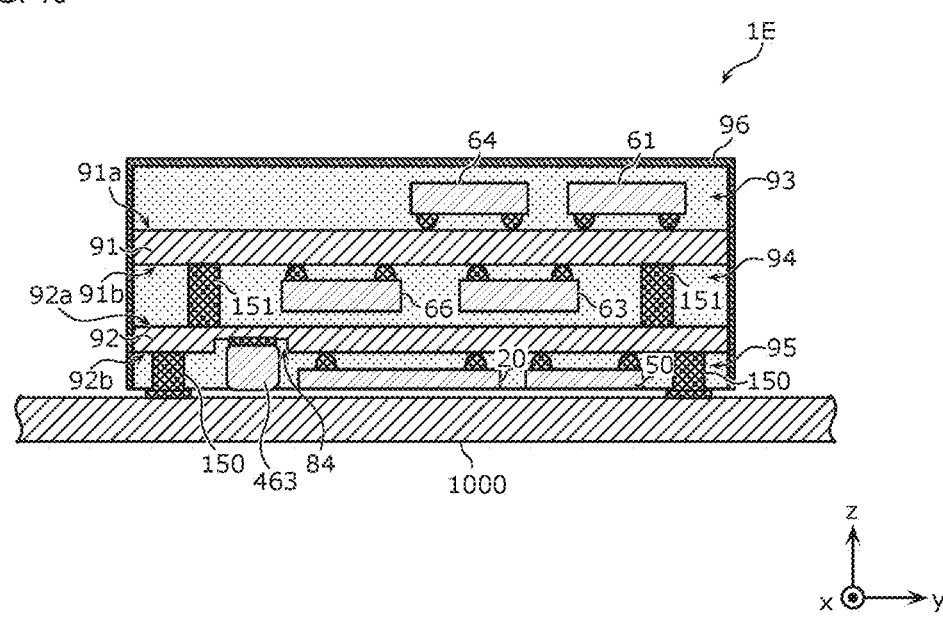
FIG. 15 is a cross-sectional view of the high-frequency module according to Example 5.

FIG. 12 is a plan view of the major surface 91a of the high-frequency module 1E according to Example 5. FIG. 13 is a plan view of the major surface 91b of the high-frequency module 1E according to Example 5. FIG. 13 is a view seen through the major surface 91b side of the module substrate 91 as seen in the positive z-axis direction. FIG. 14 is a plan view of the major surface 92b of the high-frequency module 1E according to Example 5. FIG. 14 is a view seen through the major surface 92b side of the module substrate 92 as seen in the positive z-axis direction. FIG. 15 is a cross-sectional view of the high-frequency module 1E according to Example 5. The cross section of the high-frequency module 1E in FIG. 15 is taken along a line xv-xv of FIGS. 12 to 14.

In the major surface 92b of the module substrate 92, the recess 84 is formed.

On the major surface 91a (the upper layer), the power amplifiers 11 and 12, matching networks 401, 411 to 413, 422, 431, 441 to 443, 452, and 461, and filters 61 and 64 are disposed.

Each of the matching networks 401, 411 to 413, 422, 431, 441 to 443, 452, and 461 is composed of a chip inductor, for example.

Each of the matching networks 411, 431, 441, and 461 is an example of the first inductor coupled between the switch 51 and the first filter. Each of the matching networks 412, 413, 442, and 443 is an example of the third inductor coupled between the power amplifier 11 or 12 and the third filter.

Between the major surfaces 91b and 92a (the middle layer), the filters 62, 63, 65, and 66 and plural inter-substrate connection terminals 151 are disposed. The resin member 94 is injected into between the major surfaces 91b and 92a and covers the electronic components disposed between the major surfaces 91b and 92a.

On the major surface 92b (the lower layer), the matching networks 432, 433, 462, and 463, integrated circuits 20 and 70, switch 51, and plural external connection terminals 150 are disposed. Each of the matching networks 432, 433, 462, and 463 is an example of the second inductor coupling between the low-noise amplifier 21 or 22 and the second filter.

In Example 5, each of the matching networks 432, 433, 462, and 463 is an example of the first electronic component and is disposed in the recess 84, which is formed in the major surface 92b. Each of the integrated circuits 20, 50, and 70 is an example of the second electronic component and is disposed outside of the recess 84 on the major surface 92b. Herein, the second electronic component is shorter in height than the first electronic component (the height of the second electronic component along the z-axis is smaller than that of the first electronic component).

In the high-frequency module 1E according to Example 5, the module substrate 92, in which the recess 84 is formed, is disposed closer to the motherboard 1000 than the module substrate 91. However, the module substrate 92, in which the recess 84 is formed, may be disposed farther from the motherboard 1000 than the module substrate 91.

[2.5.2 Effect of High-Frequency Module 1E]

As described above, the high-frequency module 1E according to Example 5 includes: the module substrate 91, which includes the major surfaces 91a and 91b opposite to each other; the module substrate 92, which includes the major surfaces 92a and 92b opposite to each other, the major surface 92a being disposed facing the major surface 91b; the plural electronic components disposed between the major surfaces 91b and 92a, on the major surface 91a, and on the major surface 92b; and the plural external connection terminals 150, which are disposed on the major surface 92b. In the major surface 92b of the module substrate 92, the recess 84 is formed. The plural electronic components include the first electronic component (the second inductor) and the second electronic component (the low-noise amplifiers 21 and/or 22), which is shorter in height than the first electronic component. The first electronic component is disposed in the recess 84, and the second electronic component is disposed in a region outside of the recess 84 on the major surface 92b.

According to such a configuration, the plural electronic components are disposed in three layers, including between the major surfaces 91b and 92a, on the major surface 91a, and on the major surface 92b. This can implement reduction in area of the high-frequency module 1E in a planar view, that is, reduction in size of the high-frequency module 1E. Furthermore, the height of the first electronic component is larger than that of the second electronic component. The first electronic component is therefore disposed in the recess 84 of the module substrate 92 while the second electronic component is disposed outside of the recess 84 in the major surface 92b. The electronic components disposed on the major surface 92b can thereby be aligned in height. This can minimize the height of the high-frequency module 1E.

In the high-frequency module 1E according to Example 5, for example, the recess 84 is formed in the major surface 92b, and the second filter may be disposed on any one of the major surfaces 91a, 91b, and 92a. The low-noise amplifiers 21 and/or 22 may be disposed in the major surface 92b.

In the light of enhancing isolation between the electronic components coupled to the input and output sides of each matching network to minimize degradation of the receiver sensitivity of the high-frequency module 1E, the second inductor requires a high Q factor among the matching networks. Inductors that require a high Q factor need to have a large volume, thus increasing in height. In order to minimize the height of the high-frequency module 1E, the second inductor (the first electronic component) is disposed in the recess 84 in the major surface 92b, and the second electronic component, which does not require a high Q factor, is disposed outside of the recess 84 in the major surface 92b. This can reduce the size of the high-frequency module 1E while minimizing degradation of the receiver sensitivity.

The communication device 5 according to Example 5 includes the RFIC 3, which processes high-frequency signals;

and the high-frequency module 1E, which transfers high-frequency signals between the RFIC 3 and the antenna 2.

According to such a configuration, the effects of the high-frequency module 1E can be implemented in the communication device 5.

(Modification)

The high-frequency module and communication device according to the present disclosure are described based on the exemplary embodiment and examples hereinabove but are not limited to the aforementioned embodiment and examples. The present disclosure includes any other example implemented by a combination of any constituent elements of the aforementioned examples, modifications obtained by performing for the aforementioned exemplary embodiment and examples, various changes that can be conceived by those skilled in the art without departing from the spirit of the present disclosure, and various devices incorporating the aforementioned high-frequency module.

In the circuit configurations of the high-frequency circuit and communication device according to the aforementioned exemplary embodiments, for example, other circuit elements, traces, and the like may be inserted in paths connecting circuit elements and signal paths disclosed in the drawings. For example, a matching network may be inserted between the switch 51 and the filter 62 and/or between the switch 51 and the filter 65.

The positions of the plural electronic components are illustrated in the aforementioned examples by way of example and are not limited to the aforementioned examples. For example, the position of any electronic component in any of the aforementioned examples may be substituted with the position of the same electronic component in the other example. Furthermore, in each example, the integrated circuit 70 including the PA controller 71 may be laid on top of the power amplifiers 11 and/or 12, for example. For example, in the high-frequency module 1A according to Example 1, the power amplifiers 11 and 12 are disposed between the major surfaces 91b and 92a, as Examples 3 and 4.

The plural external connection terminals 150 are composed of copper post electrodes in the examples but are not limited thereto. For example, the plural external connection terminals 150 may be bump electrodes. In this case, the high-frequency module does not need to include the resin member 95.

INDUSTRIAL APPLICABILITY

The present disclosure can be widely used in communication devices, including mobile phones, as a high-frequency module provided in the front end.

REFERENCE SIGNS LIST

1 HIGH-FREQUENCY CIRCUIT
1A, 1B, 1C, 1D, 1E HIGH-FREQUENCY MODULE
2 ANTENNA
3 RFIC
4 BBIC
5 COMMUNICATION DEVICE
11, 12 POWER AMPLIFIER
20, 50, 70 INTEGRATED CIRCUIT
21, 22 LOW-NOISE AMPLIFIER
51, 52, 53, 54, 55 SWITCH
61, 62, 63, 64, 65, 66 FILTER
71 PA CONTROLLER
80, 81, 82, 83, 84 RECESS
91, 92 MODULE SUBSTRATE
91a, 91b, 92a, 92b MAJOR SURFACE 93, 94, 95 RESIN MEMBER
96 SHIELD ELECTRODE LAYER
100 ANTENNA CONNECTION TERMINAL
111, 112 HIGH-FREQUENCY INPUT TERMINAL
121, 122 HIGH-FREQUENCY OUTPUT TERMINAL
131 CONTROL TERMINAL
150 EXTERNAL CONNECTION TERMINAL
151 INTER-SUBSTRATE CONNECTION TERMINAL
401, 411, 412, 413, 422, 431, 432, 433, 441, 442, 443, 452, 461, 462, 463 MATCHING NETWORK
511, 512, 513, 514, 515, 516, 517, 521, 522, 523, 524, 531, 532, 533, 541, 542, 543, 544, 551, 552, 553 TERMINAL
911, 921 GROUND CONDUCTOR
1000 MOTHERBOARD

The invention claimed is:

1. A high-frequency module, comprising:
a first module substrate including a first major surface opposite a second major surface;
a second module substrate including a third major surface opposite a fourth major surface, the third major surface being disposed to face the second major surface;
a plurality of electronic components disposed between the second major surface and the third major surface, on the first major surface, and on the fourth major surface; and
a plurality of external connection terminals disposed on the fourth major surface, wherein
a recess is formed in one of the first and second major surfaces included in the first module substrate or third and fourth major surfaces included in the second module substrate,
the plurality of electronic components include
a first electronic component, and
a second electronic component shorter in height than the first electronic component,
at least a part of the first electronic component is disposed in the recess,
the second electronic component is disposed
outside of the recess on the first major surface, the second major surface, the third major surface, or the fourth major surface in which the recess is formed, or
on the first major surface, the second major surface, the third major surface, or the fourth major surface that faces the first major surface, the second major surface, the third major surface, or the fourth major surface in which the recess is formed.

2. The high-frequency module according to claim 1, wherein
the plurality of electronic components include
a first filter,
a first switch that switches whether to couple the first filter to an antenna connection terminal, and
a first inductor coupled between the first switch and the first filter, and
the first electronic component is the first inductor.

3. The high-frequency module according to claim 2, wherein
the recess is formed in the first major surface,
the first filter is disposed on any one of the first major surface, the second major surface, and the third major surface, and
the first switch is disposed on the fourth major surface.

4. The high-frequency module according to claim 1, wherein the plurality of electronic components include a second filter, a low-noise amplifier, and a second inductor coupled between the low-noise amplifier and the second filter, and the first electronic component is the second inductor.

5. The high-frequency module according to claim 4, wherein the recess is formed in the first major surface, the second filter is disposed on any one of the first major surface, the second major surface, and the third major surface, and the low-noise amplifier is disposed on the fourth major surface.

6. The high-frequency module according to claim 4, wherein the recess is formed in the fourth major surface, the second filter is disposed on any one of the first major surface, the second major surface, and the third major surface, and the low-noise amplifier is disposed on the fourth major surface.

7. The high-frequency module according to claim 1, wherein the first module substrate is thicker than the second module substrate, or the second module substrate is thicker than the first module substrate, and the recess is formed in the one of the first module substrate and the second module substrate.

8. The high-frequency module according to claim 7, wherein the plurality of electronic components include a first filter and a second filter, a low-noise amplifier, a first switch that switches whether to couple the first filter to an antenna connection terminal, and a second inductor coupled between the low-noise amplifier and the second filter, the first electronic component is the second inductor, the high-frequency module further comprising:

a first inductor coupled between the first switch and the first filter, wherein the first inductor is disposed within the one of the first module substrate and the second module substrate.

9. The high-frequency module according to claim 1, wherein the plurality of electronic components include a power amplifier, a third filter, and a third inductor coupled between the power amplifier and the third filter, and the first electronic component is the power amplifier.

10. The high-frequency module according to claim 9, wherein the recess is formed in the second major surface, the power amplifier is disposed on the third major surface, the third filter is disposed on any one of the first major surface, the second major surface, and the third major surface, and the third inductor is disposed on the first major surface.

11. The high-frequency module according to claim 1, wherein the plurality of electronic components include a fourth filter including a filter body and an electrode terminal, the first electronic component is the fourth filter, and the electrode terminal of the fourth filter is joined to the bottom surface of the recess.

12. The high-frequency module according to claim 11, wherein the recess is formed in the second major surface.

13. A communication device, comprising:

a signal processing circuit processing a high-frequency signal; and the high-frequency module according to claim 1 which transfers the high-frequency signal between the signal processing circuit and an antenna.

14. The high-frequency module according to claim 1, further comprising a resin member configured to shield the plurality of components from moisture.

15. The high-frequency module according to claim 14, further comprising a shield electrode configured to cover the resin member and the first and second module substrates to shield the first and second module substrates from at least external noise.

16. The high-frequency module according to claim 15, wherein the shield electrode includes a thin metallic film layer.

17. The high-frequency module according to claim 8, wherein the first filter includes a bulk acoustic wave (BAW) filter.

18. The high-frequency module according to claim 8, wherein the first filter includes a surface acoustic wave (SAW) filter.

19. The high-frequency module according to claim 1, wherein at least one of the first electronic component and the second electronic component is an impedance matching network.

20. The communication device according to claim 13, wherein the high frequency module includes an impedance matching network to connect to the antenna.

* * * * *